United States Patent
Yamazaki

(10) Patent No.: US 9,634,280 B2
(45) Date of Patent: Apr. 25, 2017

(54) LIGHT-EMITTING DEVICE AND MANUFACTURING METHOD THEREOF

(75) Inventor: Shunpei Yamazaki, Tokyo (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 13/424,616

(22) Filed: Mar. 20, 2012

(65) Prior Publication Data

US 2012/0244643 A1 Sep. 27, 2012

(30) Foreign Application Priority Data

Mar. 23, 2011 (JP) ................................ 2011-064678
Mar. 25, 2011 (JP) ................................ 2011-066900

(51) Int. Cl.
*H01L 51/52* (2006.01)
*H01L 51/56* (2006.01)
*H01L 23/528* (2006.01)

(52) U.S. Cl.
CPC ...... *H01L 51/5212* (2013.01); *H01L 51/5228* (2013.01); *H01L 51/56* (2013.01); *H01L 23/528* (2013.01); *H01L 51/5275* (2013.01); *H01L 2251/5315* (2013.01); *H01L 2251/568* (2013.01)

(58) Field of Classification Search
CPC .................................................. H01L 27/3276
USPC ........................ 438/26–29, 32; 257/88–99; 313/503–506
See application file for complete search history.

(56) References Cited

U.S. PATENT DOCUMENTS

| | | | |
|---|---|---|---|
| 6,593,691 B2 | 7/2003 | Nishi et al. | |
| 6,608,449 B2 | 8/2003 | Fukunaga | |
| 6,661,445 B2 | 12/2003 | Mashimo et al. | |
| 7,026,658 B2 | 4/2006 | Park et al. | |
| 7,116,044 B2 | 10/2006 | Fukunaga | |
| 7,161,184 B2 | 1/2007 | Miyagi et al. | |
| 7,214,966 B2 | 5/2007 | Park et al. | |
| 7,214,967 B2 | 5/2007 | Park et al. | |
| 7,221,095 B2 | 5/2007 | Yamazaki et al. | |
| 7,511,419 B2 | 3/2009 | Takei et al. | |
| 7,535,646 B2 * | 5/2009 | Chari et al. ................ | 359/619 |

(Continued)

FOREIGN PATENT DOCUMENTS

| | | |
|---|---|---|
| JP | 2000-077188 A | 3/2000 |
| JP | 2002-033198 A | 1/2002 |

(Continued)

OTHER PUBLICATIONS

Taiwanese Office Action re Application No. TW 101109326, dated May 4, 2016.

*Primary Examiner* — Lex Malsawma
*Assistant Examiner* — Gardner W Swan
(74) *Attorney, Agent, or Firm* — Husch Blackwell LLP

(57) ABSTRACT

An EL light-emitting element in which a lower electrode layer, an EL layer, and an upper electrode layer are stacked is formed on a substrate, and a wiring is formed on a counter substrate. Further, the substrate and the counter substrate are bonded so that the wiring is in physical contact with the upper electrode layer of the EL element. Accordingly, the wiring can serve as an auxiliary wiring for increasing conductivity of the upper electrode layer. With such an auxiliary wiring, a potential drop due to the resistance of the upper electrode layer can be suppressed even in the light-emitting device whose light-emitting portion is large.

5 Claims, 12 Drawing Sheets

(56) References Cited

U.S. PATENT DOCUMENTS

| | | | |
|---|---|---|---|
| 7,663,306 B2 | 2/2010 | Imamura | |
| 7,667,393 B2 | 2/2010 | Fukunaga | |
| 7,733,441 B2 | 6/2010 | Seo et al. | |
| 7,812,523 B2* | 10/2010 | Jung et al. | 313/506 |
| 7,830,086 B2* | 11/2010 | Adachi et al. | 313/506 |
| 7,878,670 B2 | 2/2011 | Shibasaki et al. | |
| 8,400,055 B2* | 3/2013 | Naono | 313/504 |
| 2003/0201716 A1* | 10/2003 | Yamazaki et al. | 313/506 |
| 2004/0145858 A1* | 7/2004 | Sakurada | H05K 3/4647 |
| | | | 361/600 |
| 2004/0232830 A1 | 11/2004 | Hieda | |
| 2005/0174046 A1* | 8/2005 | Hasegawa et al. | 313/504 |
| 2005/0194896 A1* | 9/2005 | Sugita et al. | 313/506 |
| 2006/0028217 A1* | 2/2006 | Liao et al. | 324/751 |
| 2006/0125387 A1 | 6/2006 | Adachi et al. | |
| 2006/0125390 A1* | 6/2006 | Oh | H01L 27/3276 |
| | | | 313/506 |
| 2006/0158095 A1* | 7/2006 | Imamura | 313/500 |
| 2006/0189047 A1* | 8/2006 | Yamazaki | H01L 27/1214 |
| | | | 438/149 |
| 2006/0273712 A1 | 12/2006 | Yaegashi | |
| 2008/0067932 A1* | 3/2008 | Baek | H01L 27/3223 |
| | | | 313/509 |
| 2008/0079355 A1 | 4/2008 | Smith | |
| 2008/0088227 A1* | 4/2008 | Lee | H01L 51/5203 |
| | | | 313/504 |
| 2010/0096981 A1 | 4/2010 | Seo et al. | |
| 2011/0241563 A1* | 10/2011 | Kim et al. | 315/291 |

FOREIGN PATENT DOCUMENTS

| | | |
|---|---|---|
| JP | 2004-281399 A | 10/2004 |
| JP | 2006-201421 A | 8/2006 |
| JP | 2006-318776 A | 11/2006 |
| JP | 2008-525955 | 7/2008 |
| JP | 2009-117214 A | 5/2009 |
| JP | 2009-130132 | 6/2009 |
| JP | 2010-244885 A | 10/2010 |
| TW | 200307484 | 12/2003 |
| TW | 200603316 | 1/2006 |
| TW | 200632808 | 9/2006 |
| TW | 200920170 | 5/2009 |
| WO | WO 03/096755 A1 | 11/2003 |
| WO | WO 2006/067368 A1 | 6/2006 |

\* cited by examiner 109  102b  102a  101

107  105  103

123  121

109  171a  171b  103  102b 102a  101

107  171b  105

LIGHT-EMITTING DEVICE AND MANUFACTURING METHOD THEREOF

BACKGROUND OF THE INVENTION

1. Field of the Invention

The present invention relates to a light-emitting device including an organic EL element and a manufacturing method thereof.

2. Description of the Related Art

An organic EL element has been actively researched and developed. In the fundamental structure of the organic EL element, a layer containing a light-emitting organic compound is provided between a pair of electrodes. By applying a voltage to this element, light emission from the light-emitting organic compound can be obtained.

The organic EL element can be formed into a film shape; thus, a large-area element can easily be formed. Therefore, the organic EL element has a high utility value as a surface light source that can be applied to lighting or the like.

For example, a lighting device including an organic EL element is disclosed in Patent Document 1.

In addition, as for an organic EL element, there are a bottom emission type in which light emission is extracted from the substrate side, a top emission type in which light emission is extracted from the substrate surface side, and a dual emission type in which light emission is extracted from the both side of the substrate side and the substrate surface side.

REFERENCE

[Patent Document 1] Japanese Published Patent Application No. 2009-130132

SUMMARY OF THE INVENTION

In the case where an organic EL element (hereinafter, also referred to EL element or light-emitting element) is applied to a lighting device, as the area of a light-emitting portion increases, a potential drop due to the resistance of an upper electrode and a lower electrode of the EL element tends to be significant. When the potential drop is significant, there is a problem in that a difference in luminance might be seen. In order to solve the problem, the upper electrode or the lower electrode needs to be provided with an electrode as an auxiliary (also referred to as auxiliary electrode or auxiliary wiring) which is formed using a material having low resistivity.

In particular, a light-transmitting material which is used for a transparent electrode on the light extraction side has relatively high resistance; therefore, a need for providing an auxiliary electrode is high. However, particularly in the case of a top emission type (including a dual emission type) in which light emission is obtained from the substrate surface side, a pattern of the auxiliary electrode needs to be formed after formation of the EL element; accordingly, the EL element might be damaged. For example, in the case where a conductive film to be the auxiliary electrode is formed by a sputtering method, thermal and physical damage is concerned. Further, when the conductive film is processed by a photolithography method or the like, optical damage, thermal damage, melting of the EL element due to an organic solvent or the like in removal of a resist, or the like is concerned.

The present invention is made in view of the foregoing technical background. Accordingly, an object of one embodiment of the present invention is to provide a light-emitting device suitable for increasing the area of a light-emitting portion. Further, another object of one embodiment of the present invention is to provide a light-emitting device in which a potential drop due to the resistance of an upper electrode is suppressed. Another object of one embodiment of the present invention is to provide a light-emitting device with high reliability.

One embodiment of the present invention achieves at least one of the above objects.

One embodiment of the present invention is a light-emitting device including a first substrate including a light-emitting element in which a lower electrode layer, a layer containing at least a light-emitting organic compound, and an upper electrode layer are stacked in this order over an insulating surface; and a second substrate including one surface provided with an auxiliary wiring. The first substrate and the second substrate are faced to each other so that the upper electrode layer and the auxiliary wiring are electrically connected to each other.

In such a manner, a wiring is formed on the counter substrate side (second substrate side) and the wiring is in physical contact with the upper electrode of the EL element formed over the substrate (first substrate); accordingly, the wiring can serve as the auxiliary wiring for increasing conductivity of the upper electrode. According to such a structure, even in a light-emitting device with a large area, a potential drop due to the resistance of the upper electrode can be suppressed and reliability can be high.

Another embodiment of the present invention is the light-emitting device whose auxiliary wiring contains Cu.

The use of a material containing Cu for a wiring formed over the counter substrate can effectively increase the conductivity of the upper electrode.

In addition, another embodiment of the present invention is the light-emitting device in which the first substrate is formed using a metal or an alloy whose surface is subjected to insulation treatment.

By using the metal substrate whose surface is subjected to insulation treatment as the substrate where the EL element is provided, heat produced at the time of driving the light-emitting device can be effectively released, so that the light-emitting device can have high reliability.

Further, a method for manufacturing a light-emitting device, according to one embodiment of the present invention, includes the steps of forming a light-emitting element in which a lower electrode layer, a layer containing a light-emitting organic compound, and an upper electrode layer are stacked in this order over one surface of a substrate (first substrate); forming an auxiliary wiring over a counter substrate (second substrate); and bonding the first substrate to the second substrate so that the upper electrode layer and the auxiliary wiring are electrically connected to each other.

A light-emitting device manufactured by such a manufacturing method can have high reliability with a potential drop due to the resistance of the upper electrode suppressed. In addition, the auxiliary wiring for increasing conductivity of the upper electrode is provided over the counter substrate, and thus, damage to an EL element in forming the auxiliary wiring can be avoided, so that the light-emitting device can have high reliability.

Further, another method for manufacturing a light-emitting device, according to one embodiment of the present invention, includes the steps of forming a light-emitting element in which a lower electrode layer, a layer containing a light-emitting organic compound, and an upper electrode layer are stacked in this order over one surface of a substrate (first substrate); detecting the position of a defective portion in the light-emitting element by applying a voltage between the lower electrode layer and the upper electrode layer and irradiating the defective portion with laser light to repair the defective portion; forming an auxiliary wiring over a counter substrate (second substrate); and bonding the first substrate which includes the light-emitting element whose defective portion is repaired to the second substrate so that the upper electrode layer and the auxiliary wiring are electrically connected to each other.

The auxiliary wiring is provided over the counter substrate side and the substrate is bonded to the counter substrate so that the auxiliary wiring is in contact with the upper electrode of the EL element, so that a potential drop due to the resistance of the upper electrode can be suppressed; accordingly, the light-emitting device can have high reliability. In addition, the auxiliary wiring for increasing conductivity of the upper electrode is provided over the counter substrate, and thus, damage to an EL element in forming the auxiliary wiring can be avoided, so that the light-emitting device can have high reliability.

As described above, before the substrate (first substrate) where the light-emitting element (also referred to as EL element) is formed is bonded to the counter substrate (second substrate), light is emitted from the EL element by applying a voltage between the upper electrode layer and the lower electrode layer of the EL element, whereby a defective portion can be detected in advance. Further, the defective portion is irradiated with laser light just after the EL element is formed to repair the defective portion; thus, even in the case where a structural body is provided over the EL element, the defective portion of the EL element can be easily detected and repaired without influence of the structural body, so that the light-emitting device can have high reliability. In addition, the method for manufacturing a light-emitting device including the step of detecting and repairing a defective portion as described above can be employed when the area of light-emitting portion is increased, and thus, is suitable for increasing the area of light-emitting portion.

In addition, another embodiment of the present invention is a method for manufacturing a light-emitting device according to the above method, which includes a step of providing the structural body which is over the second substrate and diffuses light emitted from the light-emitting element and whose focal surface with respect to visible light does not cross the light-emitting element.

Further, the structural body for diffusing light emitted from the EL element is formed over the counter substrate; thus, the repaired region by irradiation with laser light from which light emission can not be obtained becomes inconspicuous by light which is emitted from another normal region diffused by the structural body.

It is preferable that the structural body provided over the counter substrate and for diffusing light emitted from the EL element be provided so that focal surface of the structural body with respect to visible light does not cross the light-emitting element (or a defective portion in the EL element) when seen from the counter substrate side because when the EL element emits light and is seen from the counter substrate side, the repaired portion becomes inconspicuous without forming an image on the repaired portion, which is further effective. Particularly, when the structural body for diffusing light emitted from the EL element has a structure in which two kinds of microlens arrays which are different in shapes are stacked, the focal surfaces of the microlens arrays can be separated enough from the EL element; thus, the repaired portion from which light emission can not be observed becomes more inconspicuous.

In addition, a method for manufacturing a light-emitting device, according to one embodiment of the present invention, is characterized in that when the position of a defective portion in the light-emitting element is detected by applying a voltage between the lower electrode layer and the upper electrode layer, the defective portion is detected by measuring visible light or infrared light.

A light-emission defect of an EL element may include phenomena of generating an area in which luminance intensity (also referred to as luminance) is locally high or low or in which light emission can not be obtained. Therefore, the defective portion can be detected by measuring light intensity of wavelength in the visible light region. In addition, a potential defective portion in which luminance intensity is not different from another normal region but current flowing therein is larger than another normal region produces much heat. Such a potential defective portion can be detected in advance by observing infrared light to detect the heat-producing portion.

In addition, another embodiment of the present invention is a method for manufacturing a light-emitting device, which includes a step of detecting the presence or absence of a defect in the following manner: a voltage is applied between the lower electrode layer and the upper electrode layer before the first substrate and the second substrate are bonded, and current flowing between the lower electrode layer and the upper electrode layer and assumed current.

A short circuit of the upper electrode and the lower electrode of the EL element or a potential defect due to an incompletely short circuit in which the EL layer is relatively thin appears as increase in current flowing when a voltage is applied between the upper electrode and the lower electrode. Accordingly, current value between the upper electrode and the lower electrode and current value assumed in the normal condition are compared with each other, so that whether there is a short-circuited portion or a potential defective portion in the EL element or hot can be determined in advance.

In addition, a method for manufacturing alight-emitting device, according to one embodiment of the present invention, is characterized in that a substrate formed of a metal or an alloy whose surface is subjected to insulation treatment is used as the first substrate.

By using the metal substrate whose surface is subjected to insulation treatment as the substrate where the EL element is provided, heat produced at the time of driving the light-emitting device can be effectively released, so that the light-emitting device can have high reliability.

Note that in this specification, an EL layer refers to a layer provided between a pair of electrodes of a light-emitting layer and including at least a layer containing a light-emitting organic compound (also referred to as light-emitting layer), or a stack including the light-emitting layer.

According to one embodiment of the present invention, a light-emitting device which is suitable for increasing the area of a light-emitting portion can be provided. Further, a light-emitting device in which a potential drop due to the resistance of an upper electrode is suppressed can be provided. Further, a highly-reliable light-emitting device can be provided.

DETAILED DESCRIPTION OF THE INVENTION

Figure 1A:
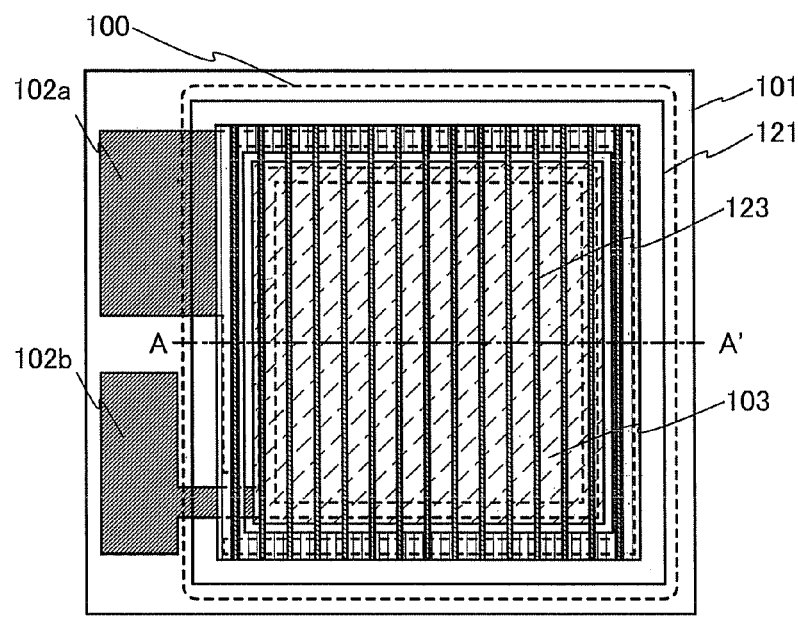
FIGS. 1A and 1B illustrate a light-emitting device according to one embodiment of the present invention.

Embodiments will be described in detail with reference to the drawings. Note that the invention is not limited to the following description, and it will be easily understood by those skilled in the art that various changes and modifications can be made without departing from the spirit and scope of the invention. Therefore, the present invention should not be construed as being limited to the description in the following embodiments. Note that in the structures of the invention described below, the same portions or portions having similar functions are denoted by the same reference numerals in different drawings, and description of such portions is not repeated.

Note that in each drawing described in this specification, the size, the layer thickness, or the region of each component is exaggerated for clarity in some cases. Therefore, embodiments of the present invention are not limited to such scales.

Embodiment 1

In this embodiment, a structure of a light-emitting device according to one embodiment of the present invention will be described with reference to FIGS. 1A and 1B, FIGS. 2A and 2B, and FIGS. 3A and 3B.

Structural Example

A light-emitting device 100, described as an example in this embodiment is a top-emission light-emitting device in which light is emitted to a side opposite to a substrate where an EL element is provided.

Figure 1B:
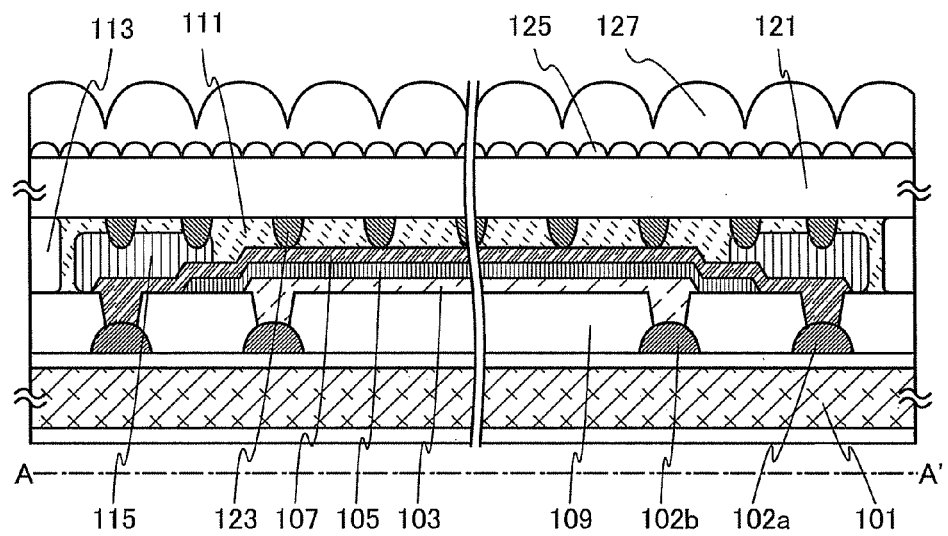

FIG. 1A is a schematic top view of the light-emitting device 100 described as an example in this embodiment. FIG. 1B is a schematic cross-sectional view taken along cutting line A-A' in FIG. 1A. Note that an upper electrode layer 107, a lens array 125, and a lens array 127, and the like which are described later are not illustrated in FIG. 1A for simplicity.

First, the light-emitting device 100 will be briefly described. The light-emitting device 100 includes an EL light-emitting element (EL element) in which a lower electrode layer 103, an EL layer 105, and the upper electrode layer 107 are stacked between a substrate 101 and a counter substrate 121.

Further, the light-emitting device 100 includes main wirings 102a and 102b over the substrate 101, a planarization film 109 and the lower electrode layer 103, the EL layer 105, and the upper electrode layer 107 over the planarization film 109. In addition, the counter substrate 121 includes the lens arrays 125 and 127. The substrate 101 and the counter substrate 121 are surrounded by and sealed with a sealing material 113, and a sealant 111 is provided on an inner side than the sealing material 113.

In addition, an auxiliary wiring 123 is provided over a surface of the counter substrate 121, which faces the substrate 101, and is in contact with the upper electrode layer 107. Further, a connector 115 is provided in a region not overlapping with the lower electrode layer 103, and the auxiliary wiring 123 is electrically connected to the upper electrode layer 107 through the connector 115.

Next, a configuration of the light-emitting device 100 will be described in detail.

The substrate 101 has an insulating surface and is formed using a material capable of withstanding heat in a process of manufacturing the light-emitting device 100. It is preferable that a substrate whose surface is subjected to insulation treatment, which is formed using a material having high thermal conductivity such as a metal or an alloy and be used as the substrate 101, because heat produced at the time of driving the light-emitting device 100 can be effectively released. For example, a metal substrate over which an insulating film is formed by a CVD method, a sputtering method, or the like, or a metal substrate whose surface is subjected to insulation treatment by an anodic oxidation method or the like can be used. With the surface subjected to insulation treatment, the metal substrate can be suppressed from corroding by an atmosphere outside the light-emitting device 100; thus, a light-emitting device can have high reliability.

In this embodiment, a metal substrate formed of aluminum, whose surface is oxidized by an anodic oxidation method to form aluminum oxide (also referred to as anodizing treatment) is used as the substrate 101.

The main wirings 102a and 102b formed over the substrate 101 are electrically connected to the upper electrode layer 107 and the lower electrode layer 103 of the EL element, respectively, through contact holes provided in the planarization film 109. In addition, the main wirings 102a and 102b are led to an outer side than a region where the main wirings 102a and 102b is overlapped with the counter substrate 121, and can be connected to an AC-DC converter. An AC-DC converter converts an alternating current voltage from an external power source for home use or the like into a direct current voltage adjusted to an appropriate voltage for driving the light-emitting device 100.

The main wirings 102a and 102b preferably have low-resistance conductivity. For example, a conductive film which is relatively thick and is formed by a plating method or the like can be used. In addition, it is preferable that the main wirings 102a and 102b be formed by a printing method such as a screen printing method, because the number of steps can be reduced and low-resistance wirings can be formed.

The planarization film 109 is formed over the main wirings 102a and 102b. In addition, the planarization film 109 has contact holes reaching the main wirings 102a and 102b. Here, when a metal substrate whose surface is insulated is used as the substrate 101, for example, the insulating surface might have a pin hole or an uneven portion. Such a pin hole and an uneven portion can be covered with the planarization film 109 provided over the substrate 101, which is effective. Further, even in the case where the main wirings 102a and 102b are formed by a printing method or the like, uneven surfaces of the main wirings 102a and 102b can be covered with the planarization films 109, so that planarized top surfaces of the planarization films 109 over the main wirings 102a and 102b can be obtained; thus, the EL element can be also formed over the main wirings 102a and 102b and a light-emitting area can be increased.

The lower electrode layer 103 forming the EL element is electrically connected to the main wiring 102b through one of the contact holes provided in the planarization film 109. Further, the EL layer 105 is formed to cover the lower electrode layer 103. Furthermore, the upper electrode layer 107 is formed to cover the EL layer 105 and is electrically connected to the main wiring 102a through another one of the contact holes provided in the planarization film 109.

The EL element included in the light-emitting device 100 described as an example in this embodiment is a top-emission EL element in which light is emitted to the substrate surface side. Thus, a material having a property of transmitting light emitted from the EL layer 105 is used for the upper electrode layer 107. In addition, a material having a property of reflecting light emitted from the EL layer 105 is used for a surface of the lower electrode layer 103.

Therefore, in the light-emitting device 100, light can be obtained from the surface side of the substrate 101 by applying a voltage between the wirings 102a and 102b which are led to an outer side than the counter substrate 121.

A material having a property of transmitting light emitted from the EL element can be used for the counter substrate 121. For example, an extremely thin glass substrate with a thickness of 25 µm to 100 µm can be used as the counter substrate 121. Such a glass substrate is extremely lightweight and can avoid entry of an impurity such as water from outside. In addition, the substrate is flexible, so that the light-emitting device 100 can be bent. Accordingly, the lightweight, highly reliable, and flexible light-emitting device 100 can be manufactured.

The plurality of auxiliary wirings 123 is provided over the surface of the counter substrate 121, which faces the substrate 101. The auxiliary wiring 123 preferably has low-resistance conductivity. It is particularly preferable to use copper for a conductive material used for the auxiliary wiring 123, because wiring resistance can be reduced. In the case of using aluminum for a conductive material used for the auxiliary wiring 123, contact resistance might be increased owing to reaction at the interface between the auxiliary wiring 123 and the upper electrode layer 107 caused depending on a material of the upper electrode layer 107 of the EL element. Thus, it is preferable that a surface of the auxiliary wiring 123, which is in contact with the upper electrode layer 107 be covered with a thin film formed of a high-melting-point material such as titanium.

Further, the width of the auxiliary wiring 123 is preferably as small as possible because the auxiliary wiring 123 is provided on the light-emission side of the EL element. The smaller the width of the wiring is, the more the area from which light emission is extracted can be increased. The width of the wiring is determined as appropriate in consideration of wiring resistance and the light-emitting area.

Note that in this embodiment, the auxiliary wirings 123 are not limited to being arranged in parallel in one direction, and the auxiliary wirings 123 may be arranged in grid. Further, the auxiliary wiring 123 is not necessarily long across the light-emitting element, and may be cut to the appropriate length or may be dotted and arranged in the appropriate position.

The substrate 101 and the counter substrate 121 are surrounded by and sealed with the sealing material 113. The sealing material 113 is preferably a material which is not permeable to an impurity such as water. Further, the sealing material 113 may contain a drying agent.

In addition, the sealant 111 is provided between the substrate 101 and the counter substrate 121. A material which contains an impurity such as water as little as possible is preferably used for the sealant 111. Here, the refractive index of a material used for the sealant 111 is preferably adjusted to be higher than that of the upper electrode layer 107 and lower than that of the counter substrate 121. With such an adjustment of the refractive index, total reflection of light emitted from the EL layer 105 can be suppressed at the interface between the upper electrode layer 107 and the sealant 111 or the interface between the sealant 111 and the counter substrate 121, so that light extraction efficiency can be improved.

Here, the level of a surface in the region where the upper electrode layer 107 does not overlap with the lower electrode layer 103 is low, so that the upper electrode layer 107 cannot be in contact with the auxiliary wiring 123 over the counter substrate 121 in some cases. In such a case, the connector 115 is provided over and in contact with the upper electrode layer 107 in the region, and thus, the upper electrode layer 107 can be electrically connected to the auxiliary wiring 123 through the connector 115 and conductivity of the upper electrode layer 107 can be increased.

A material which electrically connects the upper electrode layer 107 and the auxiliary wiring 123 can be used for the connector 115. For example, the connector 115 having conductivity be formed in such a manner that a conductive paste containing a conductive particle of silver, copper, or the like is formed by a printing method such as a screen printing method, and then, is baked.

In addition, a material having an anisotropic conductive property in the direction in which pressure is applied by thermocompression bonding in the process of bonding the substrate 101 and the counter substrate 121, that is, the direction perpendicular to the substrate 101, may be used for the connector 115. When the connector 115 has such a property, the auxiliary wiring 123 in contact with the connector 115 can be electrically connected to the upper electrode layer 107 owing to conductivity of the connector 115 in the direction perpendicular to the substrate 101.

Total reflection of light emitted from the EL element can be suppressed by the lens arrays 125 and 127 provided over the counter substrate 121, so that light emission can be effectively extracted. In this embodiment, the lens array 125 is provided over the surface of the counter substrate 121, which does not face the substrate 101 because an extremely thin substrate such as a glass substrate is used as the counter substrate 121; however, in the case where the counter substrate 121 is relatively thick, the counter substrate 121 is processed to have an uneven surface which serves as the lens array 125. In addition, instead of the lens arrays 125 or 127, a hemispherical lens, a microlens array, a film having uneven surface, a light diffusing film, or the like may be attached and used.

In addition, a structural body for diffusing light emitted from the EL element, such as the lens array 125 or 127, is provided on the light-emission side, and thus, a defect is repaired and a region recognized as a dark spot becomes inconspicuous by light which is emitted from another normal region and diffused by the lens arrays 125 and 127.

It is preferable that the structural body provided over the counter substrate 121 and for diffusing light emitted from the EL element, such as the lens arrays 125 or 127 be provided so that focal surface of the structural body with respect to visible light does not cross the light-emitting element (or a defective portion in the EL element) when seen from the counter substrate 121 side because when the EL element emits light and is seen from the counter substrate 121 side, the repaired portion becomes inconspicuous without forming an image on the repaired portion, which is further effective. Particularly, when the structural body for diffusing light emitted from the EL element has a structure in which two kinds of lens arrays which are different in shapes are stacked, the focal surfaces of the lens arrays can be separated enough from the EL element; thus, the repaired portion from which light emission can not be observed becomes more inconspicuous.

Figure 8A:
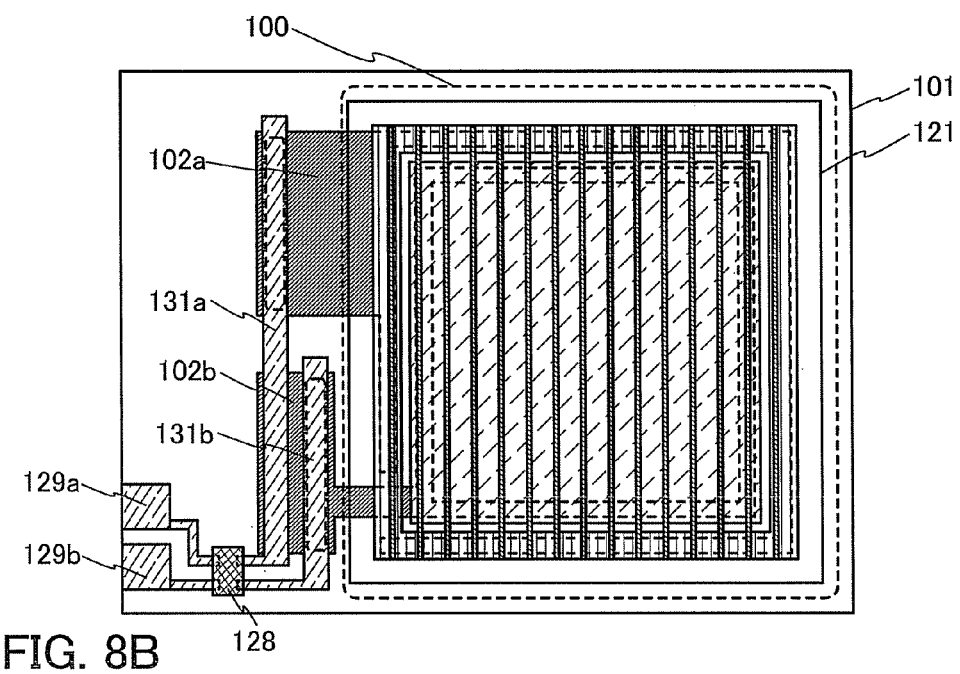
FIGS. 8A and 8B each illustrate a light-emitting device according to one embodiment of the present invention.

Here, a structural example in which a converter is connected to the light-emitting device 100 is illustrated in FIG. 8A. The light-emitting device 100, a converter 128, and connection electrodes 129a and 129b are provided over the substrate 101. Input terminals of the converter 128 are electrically connected to the connection electrodes 129a and 129b for connecting to a power source for home use or the like. One of two output terminals of the converter 128 is electrically connected to the main wiring 102a of the light-emitting device 100 through a wiring 131a, and the other of the output terminals is electrically connected to the main wiring 102b through a wiring 131b. Note that the wiring 131a is electrically connected to the main wiring 102a through a contact hole, and the wiring 131b is electrically connected to the main wiring 102b through a contact hole.

As the converter 128, an AC-DC converter for converting an alternating current voltage from a power source for home use or the like into a direct current voltage adjusted to an appropriate voltage for driving the light-emitting device 100 can be used. The converter 128 is electrically connected to the main wirings 102a and 102b of the light-emitting device 100 and supplies the converted direct current voltage to the light-emitting device 100 to drive the light-emitting device 100.

Figure 8B:
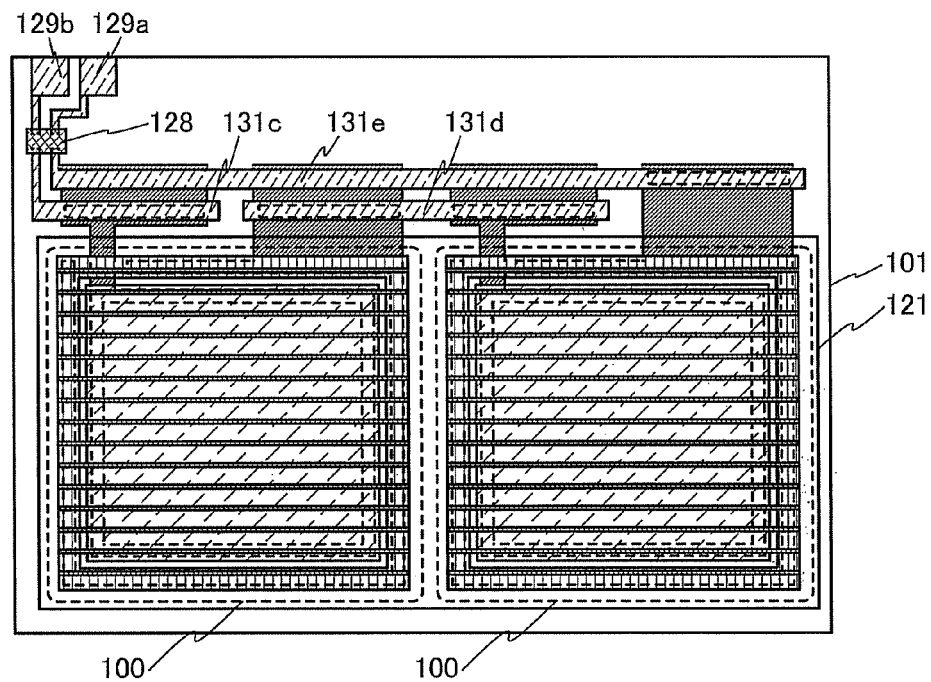

Further, a structure as illustrated in FIG. 8B may be employed in which a pair of light-emitting devices 100 is provided over the substrate 101 and the main wirings of the light-emitting devices 100 are connected in series using external wirings (wirings 131c, 131d, and 131e) so that the pair of light-emitting devices 100 is driven by one converter 128. The pair of light-emitting devices 100 is connected in series and thus an effective driving voltage in the entire device can be increased, so that power conversion efficiency of the converter 128 can be improved as compared to the case of using one light-emitting device. Note that two light-emitting devices are connected in series here; however, three or more light-emitting devices may be connected in series or a plurality of light-emitting devices may be connected in parallel. Alternatively, a plurality of light-emitting devices may be connected in combination of a series connection and a parallel connection. When a plurality of light-emitting devices is connected to each other, the number of converters 128 with respect to one light-emitting device can be reduced, which is preferable.

The light-emitting device with the above structure can have high reliability with a potential drop due to the resistance of the upper electrode of the EL element suppressed because conductivity of the upper electrode of the EL element is increased by the auxiliary wiring provided over the counter substrate. Further, the auxiliary wiring can be easily formed over the counter substrate; thus, the structure is suitable for increasing the area of a light-emitting portion. In addition, the substrate where the EL element is provided and the counter substrate may be bonded so that the auxiliary wiring provided over the counter substrate is provided an inner side than at least a sealing region and high positioning accuracy is not need; accordingly, the structure is suitable for increasing the area of the substrate.

Next, another embodiment of a light-emitting device which is different from the above will be described as an example.

In many cases, in an AC-DC converter for converting an alternating current voltage from a power source for home use into a direct current voltage for driving a light-emitting device, conversion efficiency tends to be reduced as a voltage value after the conversion is smaller. In view of the above, a plurality of light-emitting devices is connected in series to increase an effective driving voltage as the entire device, so that conversion efficiency of AC-DC converter can be improved. Hereinafter, embodiments of two kinds of light-emitting devices in each of which a plurality of EL elements is connected in series will be described.

Note that description of the common portions to those in the light-emitting device 100 will be omitted here.

Modified Example 1

Figure 2A:
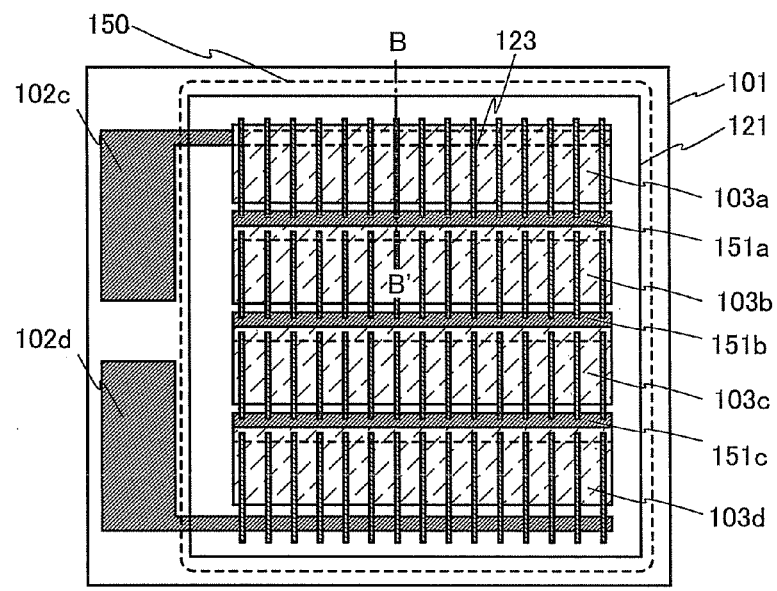
FIGS. 2A and 2B illustrate a light-emitting device according to one embodiment of the present invention.
Figure 2B:
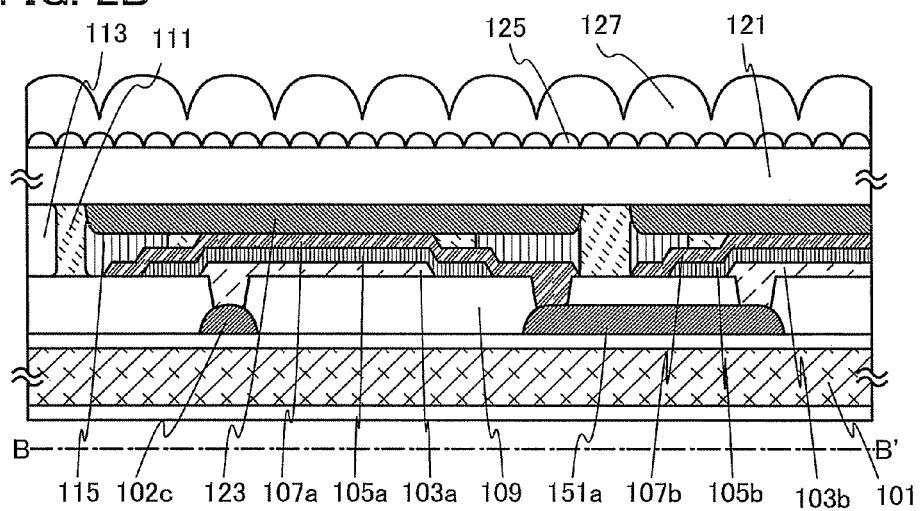

A light-emitting device 150 illustrated in FIGS. 2A and 2B is a light-emitting device in which four EL elements are connected in series. FIG. 2A is a schematic top view of the light-emitting device 150. FIG. 2B is a schematic cross-sectional view taken along cutting line B-B' which is along the auxiliary wiring 123 in FIG. 2A. Note that only a substrate, a counter substrate, a main wiring, a sub wiring, a lower electrode layer, and the auxiliary wiring are illustrated in FIG. 2A for simplicity.

A main wiring 102c is connected to a first lower electrode layer 103a. In addition, a first EL layer 105a and a first upper electrode layer 107a are formed over the first lower electrode layer 103a to form a first EL element.

Further, the first upper electrode layer 107a is in contact with and electrically connected to a first sub wiring 151a.

The first sub wiring 151a is in contact with and electrically connected to a second lower electrode layer 103b. In addition, a second EL layer 105b and a second upper electrode layer 107b are formed over the second lower electrode layer 103b to form a second EL element.

Thus, the first EL element is connected to the second EL element in series through the first sub wiring 151a. Similarly, the second EL element is connected in series to a third EL element including a third lower electrode layer 103c, a third EL layer 105c, and a third upper electrode layer 107c, through a second sub wiring 151b. In addition, the third EL element is connected in series to a fourth EL element including a fourth lower electrode layer 103d, a fourth EL layer 105d, and a fourth upper electrode layer 107d, through a third sub wiring 151c. In such a manner, all the four EL elements are connected in series.

Here, the fourth upper electrode layer 107d is in contact with and electrically connected to a main wiring 102d.

The main wiring 102c and the main wiring 102d are led to an outer side than the counter substrate 121 and can be connected to an AC-DC converter.

In addition, the auxiliary wiring 123 is formed over the counter substrate 121 to be in contact with each the upper electrode layer, and thus, conductivity of the upper electrode layers is increased by the auxiliary wiring 123. The connector 115 having conductivity may be formed over the upper electrode layer as needed.

In the light-emitting device 150 with such a structure, a plurality of EL elements is connected in series to increase an effective driving voltage, so that a decrease in conversion efficiency of an AC-DC converter which is connected to the light-emitting device 150 can be suppressed; thus, the light-emitting device with lower power consumption can be provided. In addition, the auxiliary wiring provided over the counter substrate increases conductivity of the upper electrode of the EL element, and thus, the light-emitting device in which a potential drop due to the resistance of the upper electrode is suppressed can be provided.

Modified Example 2

Figure 3A:
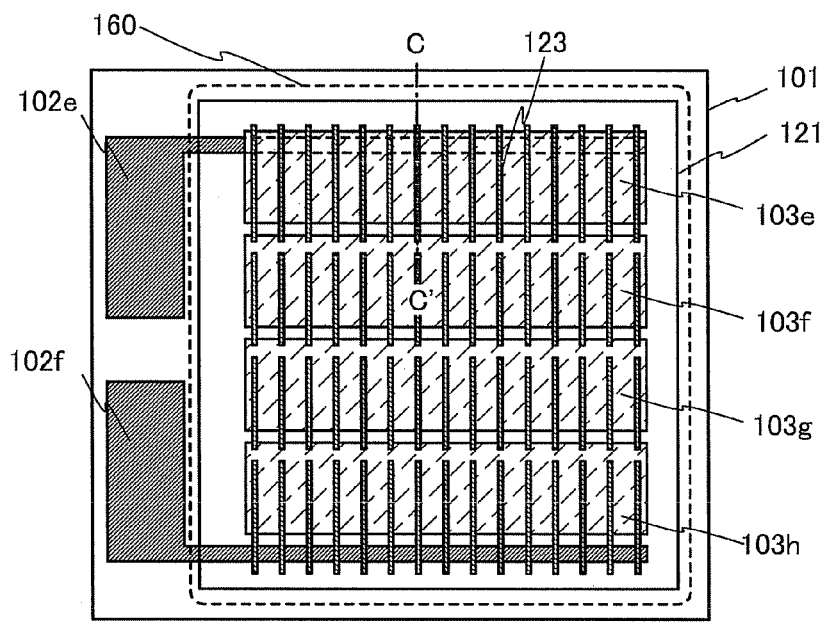
FIGS. 3A and 3B illustrate a light-emitting device according to one embodiment of the present invention.
Figure 3B:
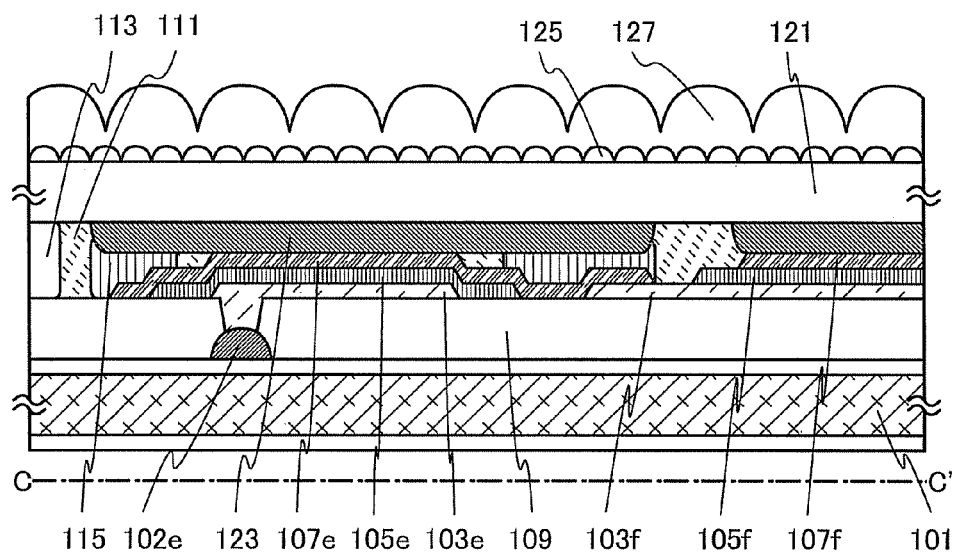

A light-emitting device 160 illustrated in FIGS. 3A and 3B is a light-emitting device in which four EL elements are connected in series. FIG. 3A is a schematic top view of the light-emitting device 160. FIG. 3B is a schematic cross-sectional view taken along cutting line C-C' which is along the auxiliary wiring 123 in FIG. 3A. Note that only a substrate, a counter substrate, a main wiring, a lower electrode layer, and the auxiliary wiring are illustrated in FIG. 3A for simplicity.

A main wiring 102e is connected to a first lower electrode layer 103e. In addition, a first EL layer 105e and a first upper electrode layer 107e are formed over the first lower electrode layer 103e to form a first EL element.

Further, the first upper electrode layer 107e is in contact with and electrically connected to a first lower electrode layer 103f. In addition, a second EL layer 105f and a second upper electrode layer 107f are formed over the second lower electrode layer 103f to form a second EL element.

Thus, the first EL element is connected to the second EL element in series. Similarly, the second EL element is connected in series to a third EL element including a third lower electrode layer 103g, a third EL layer 105g, and a third upper electrode layer 107g. In addition, the third EL element is connected in series to a fourth EL element including a fourth lower electrode layer 103h, a fourth EL layer 105h, and a fourth upper electrode layer 107h. In such a manner, all the four EL elements are connected in series.

Here, the fourth upper electrode layer 107h is in contact with and electrically connected to a main wiring 102f.

The main wiring 102e and the main wiring 102f are led to an outer side than the counter substrate 121 and can be connected to an AC-DC converter.

In addition, the auxiliary wiring 123 is formed over the counter substrate 121 to be in contact with each the upper electrode layer, and thus, conductivity of the upper electrode layers is increased by the auxiliary wiring 123. The connector 115 having conductivity may be formed over the upper electrode layer as needed.

In the light-emitting device 160 with such a structure, a plurality of EL elements is connected in series to increase an effective driving voltage, so that a decrease in conversion efficiency of an AC-DC converter which is connected to the light-emitting device 160 can be suppressed; thus, the light-emitting device with lower power consumption can be provided. In addition, the auxiliary wiring provided over the counter substrate increases conductivity of the upper electrode of the EL element, and thus, the light-emitting device in which a potential drop due to the resistance of the upper electrode is suppressed can be provided.

The light-emitting device with the above structure can be manufactured by a manufacturing process of one embodiment of the present invention which is described later. The light-emitting device manufactured through the above process can have high reliability in which an emission defect of the EL element is extremely reduced. Further, the manufacturing process including steps of detecting and repairing a defective portion can be easily employed when the area of the light-emitting portion is increased, and thus, is suitable for increasing the area of the light-emitting portion. Furthermore, an uneven structural body such as a lens array is formed on the light-emission side to diffuse light emission, whereby a defective portion becomes inconspicuous.

<Material and Manufacturing Method>

Here, materials which can be used for the structures and a manufacturing method of the materials will be described. Note that materials are not limited to one described below, and a material having a similar function can be used as appropriate.

[Substrate]

As the material of the substrate provided on the light-emission side, a material with a light-transmitting property, such as glass, quartz, or an organic resin can be used. As the material of the substrate provided on the opposite side of the light-emission side, a light-transmitting property is not always necessary, and a material such as a metal, a semiconductor, ceramics, and a colored organic resin can be used other than the above materials. In the case where a conductive substrate is used, the substrate preferably has an insulating property by oxidation of its surface or formation of an insulating film over the surface.

As a method by which a surface of a conductive substrate such as a metal substrate or an alloy substrate is insulated, an anodic oxidation method, an electrodeposition method, or the like can be used. In the case where an aluminum substrate is used as the substrate, for example, aluminum oxide formed over the surface by an anodic oxidation method has a high insulating property and the aluminum oxide layer can be formed thin, which is preferable. In addition, an organic resin such as a polyamide-imide resin, or an epoxy resin can be formed over the substrate surface by an electrodeposition method. Such an organic resin has a high insulating property and flexibility; thus, a crack hardly occurs in the surface even when the substrate is bent. In addition, when a material with high heat resistance is used, deformation of the substrate surface due to heat generated at the time of driving the light-emitting device can be suppressed.

In the case where an organic resin is used for the substrates, for example, any of the following can be used as the organic resin: polyester resins such as polyethylene terephthalate (PET) and polyethylene naphthalate (PEN), a polyacrylonitrile resin, a polyimide resin, a polymethylmethacrylate resin, a polycarbonate (PC) resin, a polyethersulfone (PES) resin, a polyamide resin, a cycloolefin resin, a polystyrene resin, a polyamide imide resin, a polyvinylchloride resin, and the like. Further, a substrate in which a glass fiber is impregnated with an organic resin or a substrate in which an inorganic filler is mixed with an organic resin can also be used.

In particular, in the case of a top-emission light-emitting device, as the substrate on the opposite side of the light-emission side where an EL element is formed, a high-thermal-conductive substrate such as a metal substrate or an alloy substrate is preferably used. In the case of a large lighting device including an EL element, heat from the EL element becomes a problem in some cases; therefore, heat dissipation can be increased with the use of such a substrate having high thermal conductivity. For example, when a substrate of aluminum oxide, duralumin, or the like is used other than a stainless steel substrate, reduction in weight and high thermal dissipation can be achieved. When a stack of aluminum and aluminum oxide, a stack of duralumin and aluminum oxide, a stack of duralumin and magnesium oxide, or the like is used, the surface of the substrate can have an insulating property, which is preferable.

[Light-Emitting Element]

As a light-transmitting material which can be used for an electrode layer through which light is extracted, indium oxide, indium tin oxide (ITO), indium zinc oxide, zinc oxide, zinc oxide to which gallium is added, graphene, or the like can be used.

Alternatively, for the electrode layer, a metal material such as gold, silver, platinum, magnesium, nickel, tungsten, chromium, molybdenum, iron, cobalt, copper, palladium, or titanium, or an alloy of any of these metal materials can be used. Further, a nitride of the metal material (such as titanium nitride) or the like may be used. In the case of using the metal material (or the nitride thereof), the electrode layer may be thinned so as to be able to transmit light.

Further, a stacked film of any of the above materials can be used as the electrode layer. For example, when a stacked film of ITO and an alloy of silver and magnesium is used, conductivity can be increased, which is preferable.

The thickness of the electrode layer through which light is extracted is, for example, greater than or equal to 50 nm and less than or equal to 300 nm, preferably greater than or equal to 80 nm and less than or equal to 130 nm, further preferably greater than or equal to 100 nm and less than or equal to 110 nm.

An EL layer includes at least a layer containing a light-emitting organic compound. In addition, the EL layer can have a stacked-layer structure in which a layer containing a substance having a high electron-transport property, a layer containing a substance having a high hole-transport property, a layer containing a substance having a high electron-injection property, a layer containing a substance having a high hole-injection property, a layer containing a bipolar substance (substance having a high electron-transport property and a high hole-transport property), and the like are combined as appropriate.

Note that in an embodiment of the present invention, a light-emitting element (tandem light-emitting element) in which a plurality of EL layers are provided between an upper electrode layer and a lower electrode layer can be used. A stacked-layer structure of two layers, three layers, or four layers (in particular, a stacked-layer structure of three layers) is preferably used. In addition, an intermediate layer containing a substance having a high electron-transport property, a substance having a high hole-transport property, or the like can be included between these EL layers. Examples of structures of the EL layer will be described in detail in Embodiment 3.

An electrode layer which is provided on the side opposite to the side from which light is extracted is formed using a reflective material. As the reflective material, a metal material such as aluminum, gold, platinum, silver, nickel, tungsten, chromium, molybdenum, iron, cobalt, copper, or palladium can be used. In addition, any of the following can be used: alloys containing aluminum (aluminum alloys) such as an alloy of aluminum and titanium, an alloy of aluminum and nickel, and an alloy of aluminum and neodymium; and alloys containing silver such as an alloy of silver and copper and an alloy of silver and magnesium. An alloy of silver and copper is preferable because of its high heat resistance. Further, a metal film or a metal oxide film is stacked on an aluminum alloy film, whereby oxidation of the aluminum alloy film can be prevented. As examples of a material for the metal film or the metal oxide film, titanium, titanium oxide, and the like are given. Aluminum can also be used for the material of the electrode layer; however, in that case, the wiring might be corroded when the wiring is provided to be in direct contact with ITO or the like. Therefore, it is preferable that the electrode layer have a stacked-layer structure and that aluminum be used for a layer which is not in contact with ITO or the like.

Note that a conductive film used for the light-emitting element can be formed by a film formation method such as an evaporation method, a sputtering method, a CVD method, or the like. In addition, the EL layer can be formed by a film formation method such as an evaporation method or an ink-jet method.

[Planarization Film]

As a material of the planarization film, for example, an organic resin such as polyimide, acrylic, polyamide, or epoxy or an inorganic insulating material can be used. For example, the planarization film is preferably formed in such a manner that a photosensitive organic resin is applied by a spin coating method, or the like, and then is subjected to selective light exposure and development. As another formation method, a sputtering method, an evaporation method, a droplet discharging method (e.g., an inkjet method), a printing method (e.g., a screen printing method or an offset printing method), or the like may be used.

[Main Wiring and Auxiliary Wiring]

In the case of forming the main wiring and the auxiliary wiring by a printing method such as a screen printing method, a conductive paste in which conductive particles having a diameter of several nanometers to several tens of micrometers are dissolved or dispersed in an organic resin is selectively printed. As the conductive particles, metal particles of one or more of silver (Ag), gold (Au), copper (Cu), nickel (Ni), platinum (Pt), palladium (Pd), tantalum (Ta), molybdenum (Mo), titanium (Ti) and the like, fine particles of silver halide, or dispersible nanoparticles can be used. In addition, as the organic resin included in the conductive paste, one or more selected from organic resins serving as a binder of metal particles, a solvent, a dispersing agent and a coating material can be used. Organic resins such as an epoxy resin or a silicone resin can be given as representative examples. Further, in forming the conductive layer, baking is preferably performed after the conductive paste is printed.

In addition, in the case where a conductive film is formed by a film formation method such as a sputtering method or a CVD method and then is selectively etched, a conductive material which is used for the light-emitting element can be used for the conductive film, as appropriate. Alternatively, the main wiring and the auxiliary wiring may be formed by a plating method.

[Sealing Material]

A known material can be used for the sealing material. For example, a thermosetting material or a UV curable material may be used. Alternatively, an epoxy resin of a two-component-mixture type may be used. A material capable of bonding inorganic materials, organic materials, or an inorganic material and an organic material may be used in accordance with an adhesion site. Further, it is desirable that a material for the sealing material allow as little moisture and oxygen as possible to penetrate through.

Note that a drying agent may be contained in the sealing material. For example, a substance which absorbs moisture by chemical adsorption, such as an oxide of an alkaline earth metal (e.g., calcium oxide or barium oxide), can be used. Alternatively, a substance which adsorbs moisture by physical adsorption, such as zeolite or silica gel, may be used as the drying agent.

The sealing material can be formed by a printing method such as a screen printing method or an ink-jet method or an application method such as a dispenser method.

[Sealant]

As the sealant, an inorganic material, an organic material, or a combination thereof which have light-transmitting properties with respect to light emitted from the EL element can be used, or a stack of these materials can be used as appropriate. Further, it is preferable that a refractive index of the sealant to the light emission be adjusted as described above. In addition, it is preferable that a material used for the sealant allow as little moisture and oxygen as possible to penetrate through, similar to the sealing material. The same material may be used for the sealant and the sealing material.

Further, the sealant can be formed by a film formation method such as a sputtering method or a CVD method, or a printing method or an application method as in the sealing material.

[Connector]

A conductive paste or the like containing conductive particles such as silver or copper can be used for the connector. By baking the conductive paste, the connector can have conductivity.

Alternatively, a thermosetting resin with which conductive metal particles are mixed may be used for the connector. As the metal particles, particles in which two or more kinds of metals are layered, for example, Ni particle which is covered with Au is preferably used. Diameter of the metal particle is greater than or equal to 100 nm and less than or equal to 100 μm, preferably greater than or equal to 1 μm and less than or equal to 50 μm. A paste material or a sheet material can be used for the connector.

The connector formed using such a material is provided between electrodes and the material and the electrode are applied with pressure and bonded while being heated, and thus, the metal particles are in contact with each other in the pressure direction. In this manner, a conductive path is formed. On the other hand, an insulating property is maintained by the resin in a direction perpendicular to the pressure direction. As a result, an anisotropic conductive property is exhibited.

The connector can be formed by a printing method or an application method, similar to the sealing material. In addition, in the case where a sheet material is used for the connector, the material can be directly bonded to a desired position.

This embodiment can be combined with any of the other embodiments in this specification as appropriate.

Embodiment 2

In this embodiment, an example of a method for manufacturing the light-emitting device 100 described as an example in Embodiment 1 will be described with reference to FIGS. 4A to 4C, FIGS. 5A and 5B, FIGS. 9A and 9B, FIGS. 10A to 10C, FIG. 11, and FIG. 12.

First, the main wirings 102a and 102b and the planarization film 109 are formed over the substrate 101.

As the substrate 101, any of the materials described in Embodiment 1 can be used. In this embodiment, an aluminum substrate which is subjected to surface oxidation treatment and whose surface is insulated is used as the substrate 101.

The main wirings 102a and 102b are formed over the substrate 101 by the method described in Embodiment 1 as an example. In this embodiment, the main wirings 102a and 102b are formed using a material containing copper by a screen printing method.

The planarization film 109 is formed to cover the exposed surface of the substrate 101 and the main wirings 102a and 102b. A photosensitive organic resin is applied by a spin coating method, and then, is selectively exposed to light and is subjected to development treatment, so that the planarization film 109 having opening portions overlapping with the main wirings 102a and 102b can be formed.

Note that the exposed portion of the substrate 101 can be covered by the planarization film 109, so that a planarized surface can be obtained. Thus, when the substrate 101 has an uneven surface, an influence of the uneven surface can be suppressed, which is preferable.

Figure 4A:
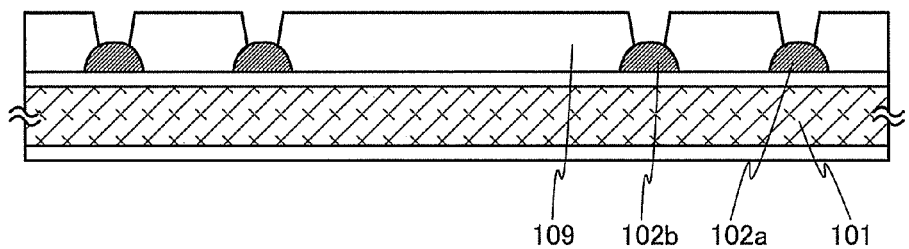
FIGS. 4A to 4C illustrate a method for manufacturing a light emitting device, according to one embodiment of the present invention.

Note that FIG. 4A illustrates a schematic cross-sectional view at this stage.

Next, the lower electrode layer 103 which is electrically connected to the main wiring 102b is formed.

The lower electrode layer 103 is formed using a material described as an example in Embodiment 1 by a film formation method such as a sputtering method. In this embodiment, as a conductive film forming the lower electrode layer 103, a film in which a titanium film and a titanium oxide film are stacked over an aluminum film is used. When aluminum which has low resistance is used for a layer lower than the titanium film, wiring resistance can be reduced. In addition, since the titanium film is formed over the lower layer, the aluminum film is not exposed and corrosion can be suppressed. Further, since a titanium oxide film is used as a layer in contact with the EL layer 105, the lower electrode layer 103 and the EL layer 105 can have an ohmic contact.

In particular, in the case where a film containing a transition metal oxide such as molybdenum oxide with a hole-injection property and a hole-transport property is used as the lowermost layer of the EL layer 105 which is in contact with the lower electrode layer 103 and a titanium oxide film is used as the outermost layer of the lower electrode layer 103 which is in contact with the film containing a transition metal oxide, contact resistance between the films can be extremely reduced, which is preferable. On the other hand, aluminum oxide or the like has an insulating property and thus the contact resistance is increased.

An end portion of the lower electrode layer 103 is preferably tapered as gentle as possible. As needed, an organic insulating film may be formed to cover the end portion to prevent disconnection caused when a step of the end portion of the lower electrode layer 103 cannot be covered with the EL layer 105 and the upper electrode layer 107. In this case, it is preferable that the organic insulating film do not overlap with the auxiliary wiring 123.

Next, the EL layer 105 is formed to cover the lower electrode layer 103 by an evaporation method. The EL layer 105 is preferably formed by using a blocking mask (also referred to as a metal mask) so that the EL layer 105 is not formed in a region where a film formation is not needed.

Further, the upper electrode layer 107 covering the EL layer 105 and electrically connected to the main wiring 102a is formed. In this embodiment, ITO is used for a conductive film forming the upper electrode layer 107 by a sputtering method.

Figure 4B:
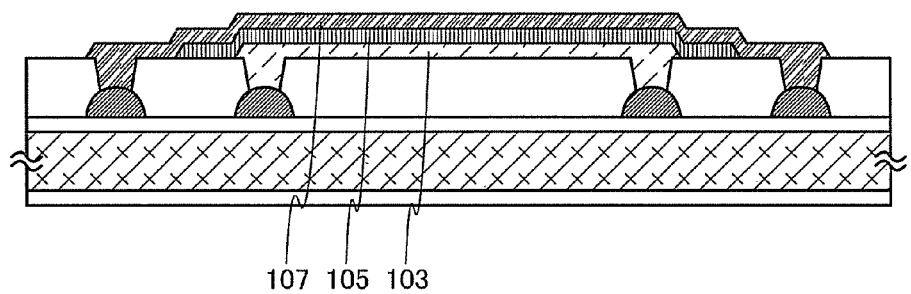

FIG. 4B illustrates a schematic cross-sectional view at this stage.

Here, a step of providing the auxiliary wiring 123 to the counter substrate 121 will be described.

A substrate formed using the material described as an example in Embodiment 1 can be used as the counter substrate 121. In this embodiment, a glass substrate with a thickness of 50 μm is used.

The auxiliary wiring 123 is formed over a surface of the counter substrate 121, which faces the substrate 101. In this embodiment, the auxiliary wiring 123 is formed by an electroless plating method. First, a thin conductive film serving as a seed layer is formed by a sputtering method, and then, a pattern is formed by a known photolithography step. Then, a copper wiring is formed using the seed layer as a nucleus by an electroless plating method.

When a copper wiring which has low resistance is used as the auxiliary wiring 123, conductivity of the upper electrode layer 107 can be more effectively increased, so that a potential drop due to the resistance of the upper electrode layer 107 can be suppressed.

Figure 4C:
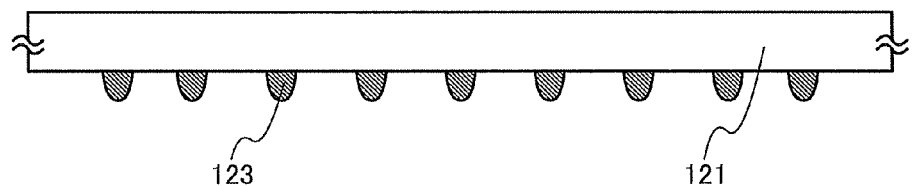

FIG. 4C illustrates a cross-sectional schematic view of the counter substrate 121 at this stage.

Next, a step of bonding the substrate 101 and the counter substrate 121 will be described.

First, the connector 115, the sealant 111, and the sealing material 113 are formed over the substrate 101. In this embodiment, each of the connector 115, the sealant 111, and the sealing material 113 is formed by a screen printing method. In addition, a material which exhibits an anisotropic conductive property by a pressure-bonding process performed later is used for the connector 115 in this embodiment.

The substrate 101 is bonded to the counter substrate 121, and then, is subjected to vacuum-pressure-bonding while being heated in a reduced pressure. Through this process, the sealant 111 and the sealing material 113 are cured by heating; thus, the substrate 101 is attached to the counter substrate 121.

At this time, the thicknesses of the sealing material 113 and the sealant 111, the pressure in the pressure-bonding process, and the like are adjusted as appropriate so that an edge portion of the auxiliary wiring 123 is physically in contact with and is electrically connected to the upper electrode layer 107.

Further, through the pressure-bonding process, the connector 115 exhibits an anisotropic conductive property owing to heat and pressure, so that the upper electrode layer 107 and the auxiliary wiring 123 which are in contact with the connector 115 are electrically connected to each other.

Figure 5A:
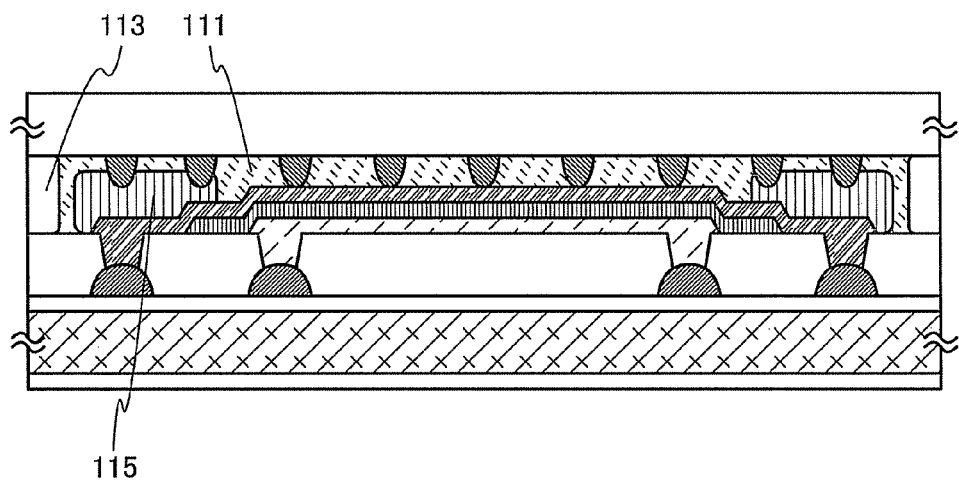
FIGS. 5A and 5B illustrate a method for manufacturing a light-emitting device, according to one embodiment of the present invention.

FIG. 5A illustrates a schematic cross-sectional view at this stage.

After the bonding is performed, the lens arrays 125 and 127 are formed over the surface of the counter substrate 121, which does not face the substrate 101. The lens arrays 125 and 127 can be formed by attaching a sheet on which lens arrays are formed. The sheet is preferably formed using a material with a high refractive index.

Figure 5B:
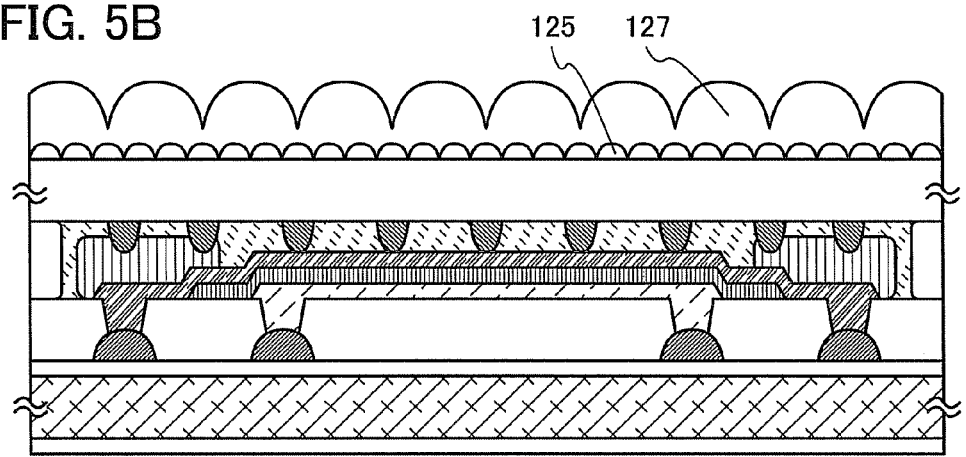

FIG. 5B illustrates a schematic cross-sectional view at this stage. Note that FIG. 5B is the same view as FIG. 1B.

Through the above-described process, the light-emitting device 100 can be manufactured. In the light-emitting device 100 manufactured through this process, a potential drop due to the resistance of the upper electrode is suppressed and reliability is high because the auxiliary wiring for increasing conductivity of the upper electrode layer of the EL element is formed without damaging the EL element. In addition, in this manufacturing method, the counter substrate may be bonded so that the auxiliary wiring provided over the counter substrate is provided an inner side than at least a sealing region, in which high positioning accuracy is not need; accordingly, the structure is suitable for increasing the area of the substrate.

Modification Example

When an EL element is formed, as a method for stacking a layer containing a light-emitting organic compound and an upper electrode in this order over a lower electrode formed over a substrate having an insulating surface, a vacuum evaporation method is given, for example. As a method for forming an island-shaped layer using a vacuum evaporation method, a method using a metal mask (also referred to as blocking mask or shadow mask), which is a metal plate provided with an opening, is known. The metal mask is provided between a substrate and an evaporation source to be in contact with the substrate, and evaporation is performed on the substrate through the opening in the metal mask, whereby a pattern of a shape in accordance with the shape of the opening can be formed.

However, when dust (including a small foreign substance referred to as a particle) attached to the metal mask, the inner wall of a vacuum evaporation apparatus, and the like is attached to the substrate, a light-emission defect such as a dark spot where light emission is not obtained due to a short-circuited EL element, a luminescent spot where luminance is higher than another normal region and which is caused by current concentration in the periphery of the spot, and the like might be caused. For example, when there is even one short-circuited portion in a light-emitting portion, the whole light-emitting portion does not emit light in some cases or luminance of the whole light-emitting portion might be decreased. When the area of light-emitting portion is increased, in particular, the probability of occurrence of such malfunctions is considerably increased.

In addition, in a light-emitting device in which an EL element is employed, a structural body needs to be provided in an upper portion than an upper electrode of the EL element. For example, in a light-emitting device in which a top-emission EL element is employed, unevenness is formed over a surface of a counter substrate in order to suppress total reflection of light emitted from the EL element, and thus, light extraction efficiency is improved. In addition, an auxiliary electrode (also referred to as auxiliary wiring) for increasing conductivity of the upper electrode may be provided on and in contact with the upper electrode of the EL element.

Accordingly, even if a light-emission defect of the EL element is recognized at the time of driving the light-emitting device in which the EL element is employed, the defective portion is hardly detected and repaired because of the structural body provided in an upper portion than the upper electrode of the EL element.

In view of the above, a method for manufacturing a light-emitting device in which a light-emission defect of an EL element is suppressed and reliability is high will be described.

Note that a description that overlaps with the portions described in the above is omitted or is simply given.

First, the main wirings 102a and 102b and the planarization film 109 are formed over the substrate 101. Then, the lower electrode layer 103 which is electrically connected to the main wiring 102b is formed. The main wirings 102a and 102b, the planarization film 109, and the lower electrode layer 103 can be formed by a method similar to the above described method.

Figure 9A:
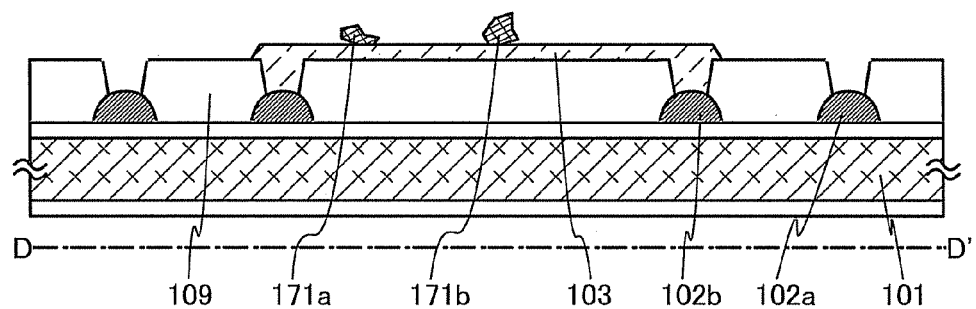
FIGS. 9A and 9B illustrate a method for manufacturing a light-emitting device, according to one embodiment of the present invention.

FIG. 9A illustrates a schematic cross-sectional view at this stage. In addition, FIG. 11 illustrates a schematic top view at this stage.

Figure 11:
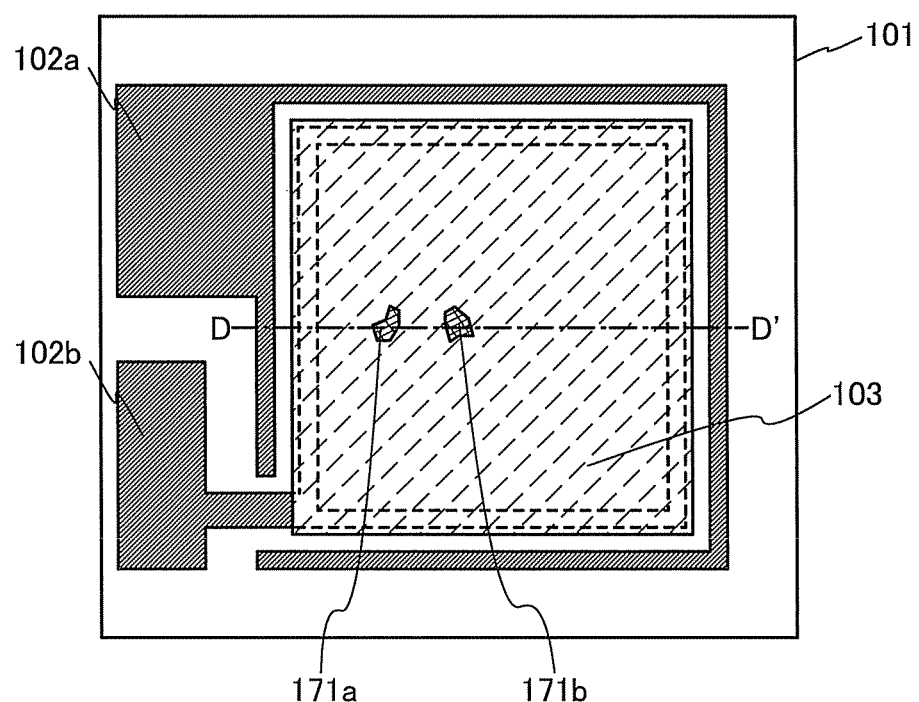
FIG. 11 illustrates a method for manufacturing a light-emitting device, according to one embodiment of the present invention.

In FIG. 9A and FIG. 11, foreign substances 171a and 171b are attached on the lower electrode layer 103. Here, FIG. 9A corresponds to a schematic cross-sectional view taken along cutting line D-D' across the foreign substances 171a and 171b in FIG. 11. The reason why the foreign substances 171a and 171b are attached is that a foreign substance attached on the inner wall of a film formation apparatus for forming the lower electrode layer 103, the EL layer 105, and the like, a blocking mask (also referred to as metal mask) used in the film formation, and the like, for example, is attached to the substrate 101.

Hereinafter, the case in which the foreign substances 171a and 171b are attached onto the lower electrode layer 103 and thus a defect region is formed in the light-emitting element in a later process will be described.

Next, the EL layer 105 is formed to cover the lower electrode layer 103 by an evaporation method in a manner similar to the above method. Further, the upper electrode layer 107 covering the EL layer 105 and electrically connected to the main wiring 102a is formed.

Figure 9B:
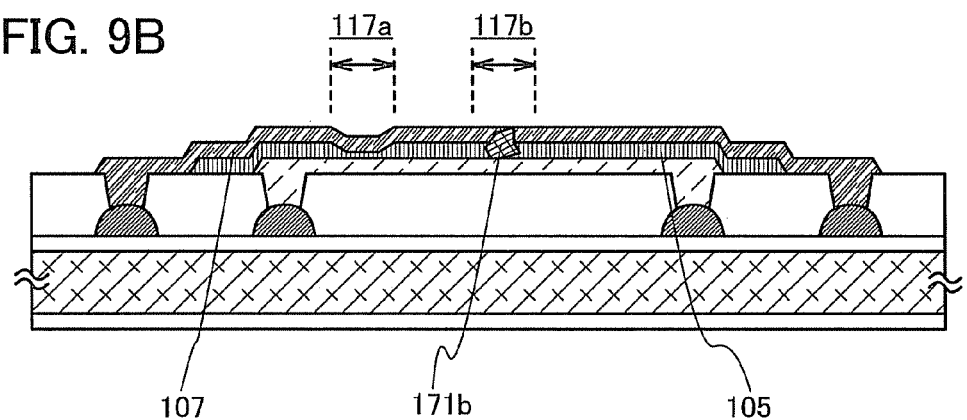

FIG. 9B illustrates a schematic cross-sectional view at this stage.

In FIG. 9B, the EL layer 105 is formed thin in a region 117a. As described below, the EL layer 105 is formed by stacking a plurality of films successively, and in the case where the foreign substance 171a moves or disappears in the film formation, for example, the EL layer 105 is formed thin in some cases, as illustrated in FIG. 9B.

Note that in the region 117a where the EL layer 105 is formed thin, electrical resistance in the film thickness direction is smaller than that in another normal region; thus, current is concentrated when a voltage is applied between the upper electrode and the lower electrode of the EL element, and in most cases, a luminescent spot where luminance is higher than that in another normal region occurs, which is recognized as a defect.

In addition, the foreign substance 171b remains in the film in the region 117b. In such a region, the upper electrode layer 107 and the lower electrode layer 103 are electrically short-circuited when the foreign substance 171b has conductivity or when the upper electrode layer 107 and the lower electrode layer 103 are in contact with each other in the periphery of the foreign substance 171b, so that a dark spot where light emission can not be obtained occurs, which is recognized as a defect. On the other hand, when the foreign substance 171b has insulating property and the upper electrode layer 107 and the lower electrode layer 103 are not in contact with each other in the periphery of the foreign substance 171b, the EL element is insulated in the periphery of the foreign substance 171b, so that a dark spot occurs, which is recognized as a defect as in the case of the short circuit. Note that in the case where a dark spot occurs due to the short circuit, depending on the electrical resistance of the short-circuited portion in the film thickness direction, the whole light-emitting portion does not emit light in some cases or whole luminance of the light-emitting portion might be decreased.

As another defect other than the above, for example, a defect caused when the upper electrode layer 107 is not formed and thus the EL element is insulated, a defect caused when both the EL layer 105 and the upper electrode layer 107 are not formed and the EL element is insulated, and the like can be given. Other than a defect due to a foreign substance, there is a defect in which the EL element is short-circuited or insulated due to a scratch made by contact between an edge of an opening of the metal mask which is used in the formation of the EL layer 105, the upper electrode layer 107, and the like and the lower layer.

In addition, a potential defect in which a luminescent spot where luminance intensity is higher than that in another normal region is not recognized because the EL layer 105 becomes relatively thin and is incompletely short circuited can be given.

In order to detect such defective portions, a voltage is applied between the main wiring 102a and the main wiring 102b so that the EL element emits light at the stage after the EL layer 105 and the upper electrode layer 107 are formed. In the case where the defective portion is detected, the defective portion is recognized as a light-emission defect such as a luminescent spot or a dark spot, or as a phenomenon in which the whole light-emitting portion does not emit light.

Here, since the main wirings 102a and 102b are led to the outer regions of the substrate 101, when a voltage is applied to the EL element with the use of an external power source or the like, the main wirings 102a and 102b can be easily connected to a terminal input to the external power source. In addition, the main wirings 102a and 102b and the terminal can be connected in a region far enough from the EL element; thus, a malfunction such that the element is broken by contact between the terminal and the EL element can be suppressed.

In order to detect a defective portion, an observation method such as an observation by the human eye, an optical microscope, or an image-sensing device by which visible light or infrared light can be observed can be employed. Even when it is difficult to observe by the human eye, heat production might be increased in a region where large current flows; thus, observation of infrared light generated by the heat is also effective. In particular, the potential defect described above has higher current value than another normal region and is thus easily detected by observation of infrared light.

In addition, it is preferable that current value of the voltage applied to the EL element at the time of emitting light from the EL element be measured. At this time, in the case where the measured current value is higher than the assumed current value, there is high possibility that somewhere in the light-emitting portion is short-circuited or the EL layer 105 has a thin portion, so that the presence or absence of a defect can be easily determined. In particular, in the case where there is the potential defect as described above, it is difficult to determine the presence or absence of the defect by luminance difference due to visible light; thus, it is effective to determine the presence or absence of a defect from the measured current value.

A defective portion is detected in this manner, and then, the defective portion is irradiated with laser light to be repaired. Specifically, a region where the defect occurs, in the upper electrode layer 107, two layers of the upper electrode layer 107 and the EL layer 105, or three layers of the upper electrode layer 107, the EL layer 105, and the lower electrode layer 103 is removed and insulated by irradiation with laser light.

Figure 10A:
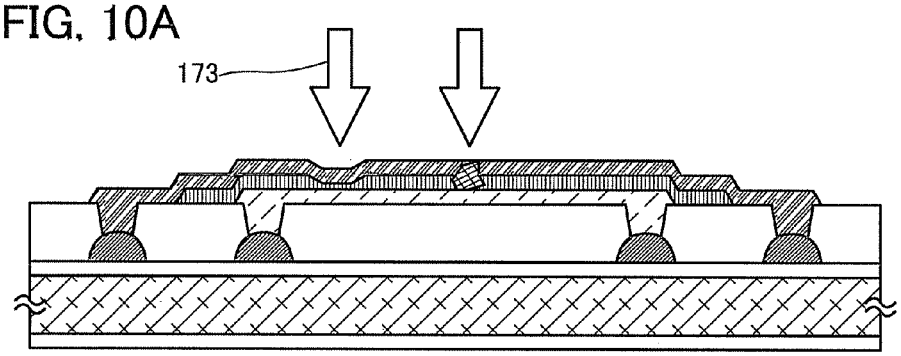
FIGS. 10A to 10C illustrate a method for manufacturing a light-emitting device, according to one embodiment of the present invention.

FIG. 10A illustrate a schematic view according to the step of irradiating with a laser light 173. The defective portion detected by the above observation method is selectively irradiated with the laser light 173.

A laser including light with a wavelength that is absorbed by at least a material used for any of the upper electrode layer 107, the EL layer 105, and the lower electrode layer 103 is used as the laser light 173. For example, it is possible to use light emitted from one or more of a gas laser such as an Ar laser, a Kr laser, or an excimer laser; or a solid-state laser such as a laser using, as a medium, single crystalline YAG, $YVO_4$, forsterite ($Mg_2SiO_4$), $YAlO_3$, or $GdVO_4$, or polycrystalline (ceramic) YAG, $Y_2O_3$, $YVO_4$, $YAlO_3$, or $GdVO_4$, to which one or more of Nd, Yb, Cr, Ti, Ho, Er, Tm, or Ta is added as a dopant, a glass laser, a ruby laser, an alexandrite laser, a Ti:sapphire laser, or a fiber laser. Alternatively, a second harmonic or a third harmonic oscillated from the above-described solid-state laser, and a higher harmonics can be used. Note that, when a solid-state laser whose laser medium is solid is used, there are advantages in that a maintenance-free condition can be maintained for a long time and output of the laser light is relatively stable. A short time pulsed laser such as nanosecond, picosecond, and femtosecond is appropriate for this process. With the short time pulsed laser, a high-density energy which causes a multiphoton absorption phenomenon can be applied to a defective portion of a light-emitting element.

Irradiation with the laser light 173 makes it possible to remove the defective portion at least in the upper electrode layer 107. Note that depending on the wavelength or the energy density of the used laser light 173, the EL layer 105 or both the EL layer 105 and the lower electrode layer 103 are also removed at the same time as the upper electrode layer 107.

Here, an example of a structure of detecting a defective portion of an EL element and irradiating with laser light will be described with reference to FIG. 12. In this structure, current flowing through the EL element is measured while applying a voltage to the EL element provided over a substrate, and at the same time, a defective portion is detected by observing light emitted from the EL element by an emission microscope, and then, the defective portion is irradiated with laser light to be repaired.

Figure 12:
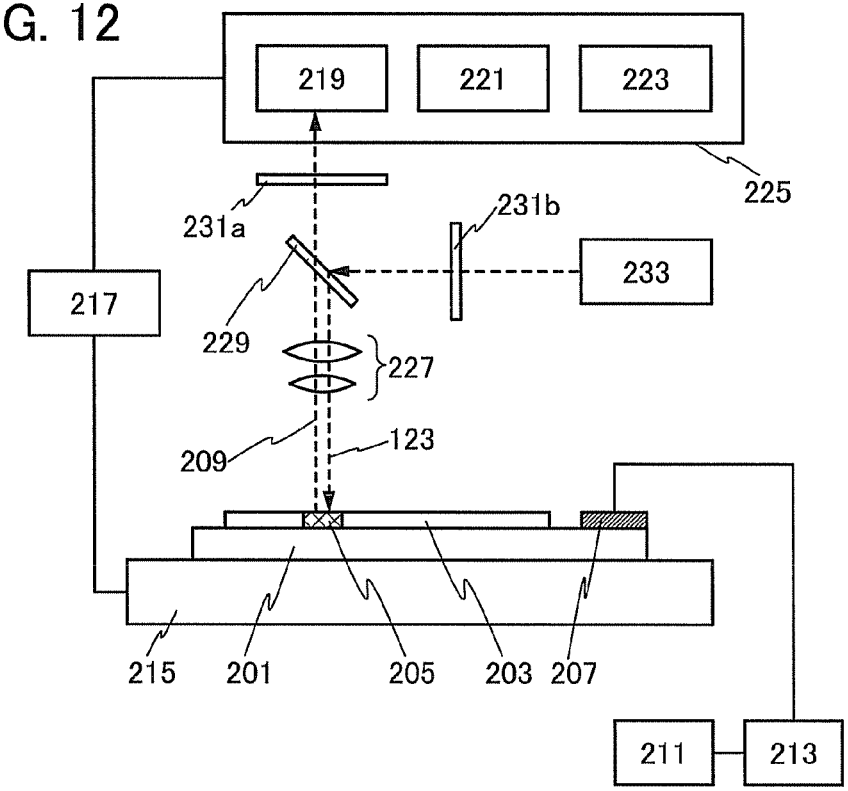
FIG. 12 illustrates a process for repairing a light-emission defect in a light-emitting device, according to one embodiment of the present invention.

Note that an EL element 203 and a main wiring 207 provided over a substrate 201 are schematically illustrated in FIG. 12 for simplicity; actually, there are two kinds of main wirings, and each of the main wirings is electrically connected to an upper electrode layer or a lower electrode layer of the EL element 203. Further, there is a defective portion 205 in a region of the EL element 203.

The substrate 201 over which the EL element 203 is formed is provided over a stage 215. In addition, the main wiring 207 provided over the substrate 201 is electrically connected to an external power source 211 through a source meter 213. Accordingly, the EL element 203 formed over the substrate 201 can emit light by the external power source 211. At this time, value of current flowing through the EL element 203 is measured by the source meter 213.

An emission microscope 225 includes a camera 219, an image processing mechanism 221, and a display device 223. The number of photons in light emitted from the EL element 203 can be observed using the camera 219 included in the emission microscope 225, and the result can be output to the display device 223 through the image processing mechanism 221.

An optical microscope including a super-sensitive high-definition camera (photon-counting camera) can be included in the camera 219. The light emission detected here is input to the image processing mechanism 221 as an image signal, subjected to image processing, and displayed on the display device 223. At this time, the image of the detected light emission is overlapped with a pattern image over the substrate 201 which is photographed in advance, so that a light emission portion can be detected. For example, on the display device 223, distribution of the number of photons of the defective portion 205 in the EL element 203 is displayed by colors; thus, a portion which is displayed by a color different from that of another normal region is observed as the defective portion 205 and the position of the defective portion 205 can be detected.

In the case of a light-emission defect which can be detected by visible light such as a luminescent spot or a dark spot, the defective portion 205 can be detected by detecting the number of photons of light emission in the visible-light region.

It is generally known that when leakage current is caused by a short circuit between electrodes, light emission of continuous spectrum in a wide range from visible light to infrared light is detected. In the case of the super-sensitive high-definition camera (photon-counting camera) used in the present invention, observation is performed utilizing the phenomenon in which a crystal containing Si transmits infrared light having a wavelength longer than a wavelength corresponding to the band gap energy of crystal, and thus, can detect a defective portion due to a short circuit.

The emission microscope 225 is connected to a position alignment mechanism 217 for moving the stage 215 and detects the position of a defective portion by observing a light emission 209 while the stage 215 is moved. In addition, the position alignment mechanism 217 moves the stage 215 to the detected position so that the defective portion 205 is irradiated with laser light based on data of the defective portion 205.

A laser device 233 can oscillate the laser light 173 with which the defective portion 205 is irradiated and the defective portion 205 is insulated.

Next, a method for repairing the defective portion 205 by laser irradiation after the position of the defective portion 205 is detected with the above structure will be described.

First, a voltage is applied between the upper electrode and the lower electrode of the EL element 203 through the main wiring 207 from the external power source 211 to make the EL element 203 emit light. At this time, current flowing through the EL element 203 is measured by the source meter 213.

The light emission 209 from the EL element 203 is detected by the camera 219 in the emission microscope 225 through a condenser lens 227, a half mirror 229, and a shutter 231a when the shutter 231a is opened, and the detected result is displayed on the display device 223 through the image processing mechanism 221. At this time, a shutter 231b is closed.

The position of the defective portion 205 is detected by the light emission 209, and then, the stage 215 is moved by the position alignment mechanism 217 so that the defective portion 205 is irradiated with laser light.

Then, the shutter 231a is closed and the shutter 231b is opened to oscillate the laser light 173 from the laser device 233. The defective portion 205 over the substrate 201 is irradiated with the laser light 173 through the half mirror 229 and the condenser lens 227.

In this manner, the defective portion 205 whose position is detected is irradiated with the laser light 173, so that the defective portion 205 can be repaired.

In addition, current flowing through the EL element 203 is measured again by the source meter 213 after the irradiation with the laser light 173. By comparing current before the irradiation and current after the irradiation, it is found whether a defect is properly repaired or not.

Note that as a method for insulating the defective portion 205 by irradiation with the laser light 173, there are a method in which a material of the upper electrode layer or the lower electrode layer is irradiated with the laser light 173 and is oxidized and thus the defective portion 205 is insulated, a method in which the defective portion 205 is physically separated by irradiation with the laser light 173 and thus is insulated, and the like. In one embodiment of the present invention, both the above methods for insulation can be performed by adjusting output of the laser light 173.

In addition, in the case of irradiation with the laser light 173, adjustments of output and irradiation time of the laser light 173 are needed so that influence of the irradiation to the periphery such as a break of a normal region other than the defective portion 205 is reduced as much as possible. The beam diameter of the laser light 173 in one embodiment of the present invention is preferably larger than the diameter of the defective portion 205 irradiated with the laser light 173, specifically, the diameter of 1.0 μm to 3.0 μm is preferable. In the case where the diameter of the defective portion 205 is larger than the beam diameter, irradiation with the laser light 173 is performed plural times while the stage 215 is moved.

The above is the description of the structure and the method for detecting a defective portion of an EL element and irradiating with laser light, as an example.

Figure 10B:
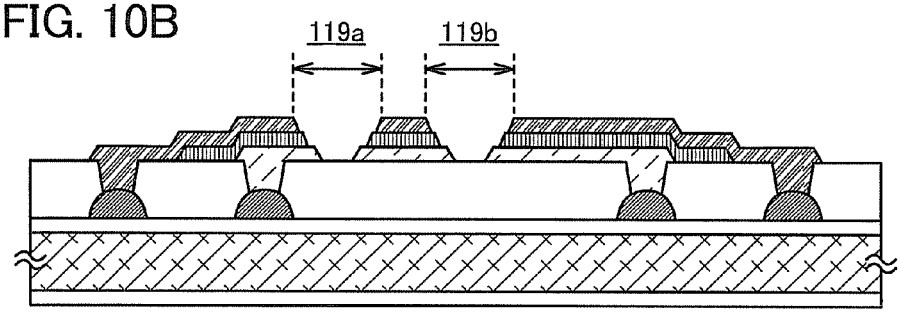

FIG. 10B is a schematic cross-sectional view at the stage after irradiation with the laser light 173 in this manner.

In the regions 119a and 119b where light-emission defects are repaired, the upper electrode layer 107, the EL layer 105, and the lower electrode layer 103 are partly removed by irradiation with the laser light 173. Accordingly, in the regions 119a and 119b, the upper electrode layer 107 is electrically separated and insulated from the lower electrode layer 103. Thus, the regions 119a and 119b are observed as dark spots from which light emission cannot be obtained even when a voltage is applied between the upper electrode and the lower electrode of the EL element.

Here, after the irradiation with the laser light 173 is completed, a voltage is preferably applied again to the main wirings 102a and 102b so that the EL element emits light, whereby it is verified whether the defective portion remains or not. Further, it is particularly preferable that current of the voltage applied to the main wirings 102a and 102b be measured and compared to an assumed current value in order to verify whether or not the defective portion is completely repaired in the entire light-emitting portion.

Here, in the case where the defect remains, the defective portion is detected and is repaired by irradiation with the laser light 173 again.

Note that detect of the defective portion and irradiation with the laser light 173 are preferably performed in an atmosphere containing an impurity such as water and oxygen as little as possible. For example, they are performed in a reduced-pressure atmosphere or an inert gas atmosphere such as a nitrogen atmosphere or a rare gas atmosphere.

Further, after the upper electrode layer 107 is formed and then a barrier film formed of an insulator which does not transmit an impurity such as water and oxygen is formed, detect of the defective portion and irradiation with the laser light 173 may be performed. A material having a light-transmitting property with respect to light emitted from the EL element is used for the barrier film.

Through the above, the process of detecting and repairing a defective portion is completed.

Next, the counter substrate 121 over which the auxiliary wiring 123 is formed is bonded to the substrate 101 by the above method.

Then, the lens arrays 125 and 127 are formed over the surface of the counter substrate 121 not facing the substrate 101.

Figure 10C:
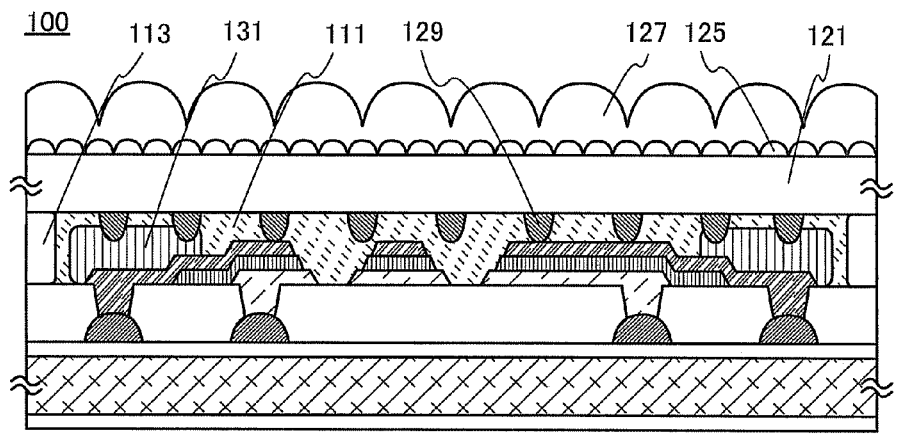

FIG. 10C illustrates a schematic cross-sectional view at this stage.

The lens arrays 125 and 127 are provided on the light-emission side, and thus, a defect is repaired and a region recognized as a dark spot becomes inconspicuous by light which is emitted from another normal region and diffused by the lens arrays 125 and 127.

It is preferable that the lens arrays 125 and 127 be provided so that focal surfaces of the lens arrays 125 and 127 with respect to visible light does not cross the EL element (or a defective portion in the EL element) when seen from the counter substrate 121 side because when the EL element emits light and is seen from the counter substrate 121 side, the repaired portion becomes inconspicuous without forming an image on the repaired portion, which is further effective. Particularly, when the lens array has a structure in which two kinds of lens arrays which are different in shapes are stacked, the focal surfaces of the lens arrays can be separated enough from the EL element; thus, the repaired portion from which light emission can not be observed becomes more inconspicuous.

Through the above process, the light-emitting device 100 can be manufactured. The light-emitting device 100 manufactured through the above process can have high reliability in which a light-emission defect of the EL element is extremely reduced. Further, the manufacturing process including the process of detecting and repairing the defective portion can be easily employed when the area of the light-emitting portion is increased, and thus, is suitable for increasing the area of the light-emitting portion. Furthermore, an uneven structural body such as a lens array is formed on the light-emission side to diffuse light emission, whereby the repaired portion of the defective portion becomes inconspicuous.

This embodiment can be combined with any of the other embodiments disclosed in this specification as appropriate.

Embodiment 3

In this embodiment, an example of an EL layer which can be applied to one embodiment of the present invention will be described with reference to FIGS. 6A to 6C.

Figure 6A:
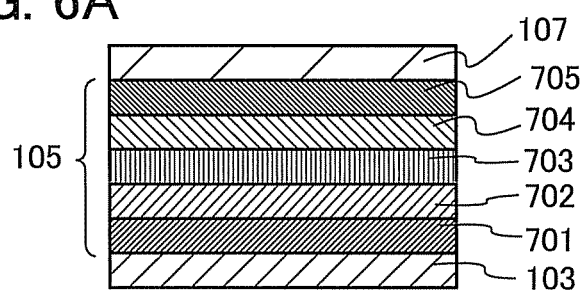
FIGS. 6A to 6C each illustrate a structure of a light-emitting element according to one embodiment of the present invention.

As illustrated in FIG. 6A, the EL layer 105 is provided between the lower electrode layer 103 and the upper electrode layer 107. The lower electrode layer 103 and the upper electrode layer 107 can have structures similar to the lower electrode layer and the upper electrode layer described as an example in the above embodiments.

A light-emitting element including the EL layer 105 described as an example in this embodiment can be used in any of the light-emitting devices described as examples in the above embodiments.

The EL layer 105 includes at least a light-emitting layer containing a light-emitting organic compound. In addition, the EL layer 105 can have a stacked-layer structure in which a layer containing a substance having a high electron-transport property, a layer containing a substance having a high hole-transport property, a layer containing a substance having a high electron-injection property, a layer containing a substance having a high hole-injection property, a layer containing a bipolar substance (substance having a high electron-transport property and a high hole-transport property), and the like are combined as appropriate. In this embodiment, in the EL layer 105, a hole-injection layer 701, a hole-transport layer 702, a layer 703 containing a light-emitting organic compound, an electron-transport layer 704, and an electron-injection layer 705 are stacked in this order from the lower electrode layer 103 side. Note that the stacking order may be inversed.

A manufacturing method of the light-emitting element illustrated in FIG. 6A will be described.

The hole-injection layer 701 is a layer that contains a substance having a high hole-injection property. As the substance having a high hole-injection property, for example, metal oxides such as molybdenum oxide, titanium oxide, vanadium oxide, rhenium oxide, ruthenium oxide, chromium oxide, zirconium oxide, hafnium oxide, tantalum oxide, silver oxide, tungsten oxide, and manganese oxide can be used. A phthalocyanine-based compound such as phthalocyanine (abbreviation: $H_2Pc$) or copper(II) phthalocyanine (abbreviation: CuPc) can be used.

In addition, aromatic amine compounds which are low molecular organic compounds or the like can be used.

Further alternatively, any of high molecular compounds (e.g., oligomers, dendrimers, or polymers) can be used. A high molecular compound to which acid is added can be used.

In particular, a composite material in which an acceptor substance is mixed with an organic compound having a high hole-transport property is preferably used for the hole-injection layer 701. With the use of the composite material in which an acceptor substance is mixed with a substance having a high hole-transport property, excellent hole injection from the lower electrode layer 103 can be obtained, which results in a reduction in the driving voltage of the light-emitting element. Such a composite material can be formed by co-evaporation of a substance having a high hole-transport property and an acceptor substance. The hole-injection layer 701 is formed using the composite material, whereby hole injection from the lower electrode layer 103 to the EL layer 105 is facilitated.

As the organic compound for the composite material, any of a variety of compounds such as aromatic amine compounds, carbazole derivatives, aromatic hydrocarbons, and high molecular compounds (e.g., oligomers, dendrimers, and polymers) can be used. The organic compound used for the composite material is preferably an organic compound having a high hole-transport property. Specifically, a substance having a hole mobility of $10^{-6}$ $cm^2/Vs$ or higher is preferably used. Note that any other substance may also be used as long as the hole-transport property thereof is higher than the electron-transport property thereof.

As the organic compound which can be used for the composite material, an aromatic amine compound, a carbazole derivative, an aromatic hydrocarbon compound having a high hole mobility can be used.

As the electron acceptor, organic compounds and transition metal oxides can be given. In addition, oxides of metals belonging to Groups 4 to 8 in the periodic table can be also given. Specifically, vanadium oxide, niobium oxide, tantalum oxide, chromium oxide, molybdenum oxide, tungsten oxide, manganese oxide, and rhenium oxide are preferable since their electron-accepting property is high. Among these, molybdenum oxide is especially preferable since it is stable in the air and its hygroscopic property is low and is easily treated.

The composite material may be formed using the above electron acceptor and the above high molecular compound and used for the hole-injection layer 701.

The hole-transport layer 702 is a layer which contains a substance with a high hole-transport property. As the substance having a high hole-transport property, for example, an aromatic amine compound can be used. The substance has a hole mobility of $10^{-6}$ $cm^2/Vs$ or higher. Note that any other substance may be used as long as the hole-transport property thereof is higher than the electron-transport property thereof. The layer containing a substance with a high hole-transport property is not limited to a single layer, and two or more layers containing any of the above substances may be stacked.

In addition, a carbazole derivative, an anthracene derivative, or high molecular compound having a high hole-transport property may also be used for the hole-transport layer 702.

For the layer 703 containing a light-emitting organic compound, a fluorescent compound which exhibits fluorescence or a phosphorescent compound which exhibits phosphorescence can be used.

Note that the layer 703 containing a light-emitting organic compound may have a structure in which any of the above light-emitting organic compounds (guest material) is dispersed in another substance (host material). As a host material, a variety of kinds of materials can be used, and it is preferable to use a substance which has a higher lowest unoccupied molecular orbital level (LUMO level) than the light-emitting material and has a lower highest occupied molecular orbital level (HOMO level) than the light-emitting material.

Plural kinds of materials can be used as the host material. For example, in order to suppress crystallization, a substance, which suppresses crystallization may be further added. In addition, a different kind of substance may be further added in order to efficiently transfer energy to the guest material.

When a structure in which a guest material is dispersed in a host material is employed, crystallization of the layer 703 containing a light-emitting organic compound can be suppressed. Further, concentration quenching due to high concentration of a guest material can be suppressed.

A high molecular compound can be used for the layer 703 containing a light-emitting organic compound.

Further, by providing a plurality of layers each containing a light-emitting organic compound and making the emission colors of the layers different, light emission of a desired color can be obtained from the light-emitting element as a whole. For example, in a light-emitting element including two layers each containing a light-emitting organic compound, the emission color of a first layer containing a light-emitting organic compound and the emission color of a second layer containing a light-emitting organic compound are made complementary, so that the light-emitting element as a whole can emit white light. Note that the word "complementary" means color relationship in which an achromatic color is obtained when colors are mixed. That is, when complementary colored light emitted from substances is mixed, white-light emission can be obtained. This can be applied to a light-emitting element including three or more layers each containing a light-emitting organic compound.

The electron-transport layer 704 is a layer that contains a substance having a high electron-transport property. The substance having a high electron-transport property is mainly one that have an electron mobility of $10^{-6}$ cm$^2$/Vs or higher. Further, the electron-transport layer is not limited to a single layer and may be a stack of two or more layers containing any of the above substances.

The electron-injection layer 705 is a layer that contains a substance having a high electron-injection property. For the electron-injection layer 705, an alkali metal, an alkaline earth metal, or a compound thereof, such as lithium, cesium, calcium, lithium fluoride, cesium fluoride, calcium fluoride, or lithium oxide, can be used. A rare earth metal compound such as erbium fluoride can also be used. Any of the above substances for forming the electron-transport layer 704 can also be used.

Note that the hole-injection layer 701, the hole-transport layer 702, the layer 703 containing a light-emitting organic compound, the electron-transport layer 704, and the electron-injection layer 705 which are described above can each be formed by a method such as an evaporation method (e.g., a vacuum evaporation method), an ink-jet method, or a coating method.

Figure 6B:
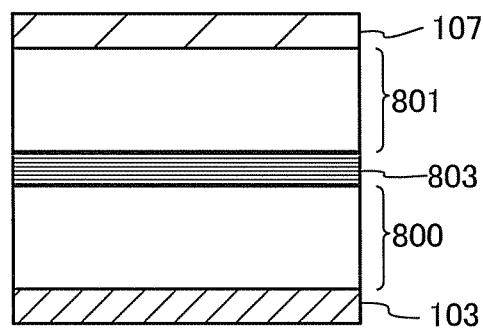

Note that a plurality of EL layers may be stacked between the lower electrode layer 103 and the upper electrode layer 107 as illustrated in FIG. 6B. In that case, a charge generation layer 803 is preferably provided between a first EL layer 800 and a second EL layer 801 which are stacked. The charge generation layer 803 can be formed using the above composite material. Further, the charge generation layer 803 may have a stacked structure including a layer formed using the composite material and a layer formed using another material. In that case, a layer containing an electron donating substance and a substance having a high electron-transport property, a layer formed of a transparent conductive film, or the like can be used as the layer containing another material. As for a light-emitting element having such a structure, problems such as energy transfer and quenching hardly occur, and a light-emitting element which has both high emission efficiency and long lifetime can be easily obtained due to expansion in the choice of materials. Moreover, a light-emitting element which provides phosphorescence from one EL layer and fluorescence from another EL layer can be easily obtained. This structure can be combined with any of the above structures of the EL layer.

Further, by forming EL layers to emit light of different colors from each other, a light-emitting element as a whole can provide light emission of a desired color. For example, by forming a light-emitting element having two EL layers such that the emission color of a first EL layer and the emission color of a second EL layer are complementary colors, the light-emitting element can provide white light emission as a whole. Note that the word "complementary" means color relationship in which an achromatic color is obtained when colors are mixed. That is, when complementary colored light emitted from substances is mixed, white-light emission can be obtained. This can be applied to a light-emitting element having three or more EL layers.

Figure 6C:
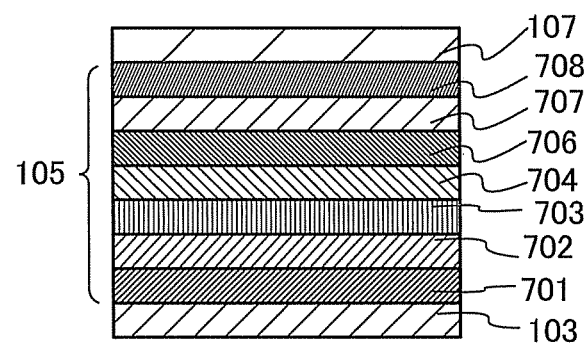

As illustrated in FIG. 6C, the EL layer 105 may include the hole-injection layer 701, the hole-transport layer 702, the layer 703 containing a light-emitting organic compound, the electron-transport layer 704, an electron-injection buffer layer 706, an electron-relay layer 707, and a composite material layer 708 which is in contact with the upper electrode layer 107, between the lower electrode layer 103 and the upper electrode layer 107.

It is preferable to provide the composite material layer 708 which is in contact with the upper electrode layer 107, in which case damage caused to the EL layer 105 particularly when the upper electrode layer 107 is formed by a sputtering method can be reduced. The composite material layer 708 can be formed using the above-described composite material in which an acceptor substance is mixed with an organic compound having a high hole-transport property.

Further, by providing the electron-injection buffer layer 706, an injection barrier between the composite material layer 708 and the electron-transport layer 704 can be reduced; thus, electrons generated in the composite material layer 708 can be easily injected to the electron-transport layer 704.

A substance having a high electron-injection property can be used for the electron-injection buffer layer 706: for example, an alkali metal, an alkaline earth metal, a rare earth metal, or a compound of the above metal (e.g., an alkali metal compound (including an oxide such as lithium oxide, a halide, or a carbonate such as lithium carbonate or cesium carbonate), an alkaline earth metal compound (including an oxide, a halide, or a carbonate), or a rare earth metal compound (including an oxide, a halide, or a carbonate)) can be used.

In the case where the electron-injection buffer layer 706 contains a substance having a high electron-transport property and a donor substance, the donor substance is preferably added so that the mass ratio of the donor substance to the substance having a high electron-transport property is from 0.001:1 to 0.1:1. Note that as the donor substance, an organic compound such as tetrathianaphthacene (abbreviation: TTN), nickelocene, or decamethylnickelocene can be used as well as an alkali metal, an alkaline earth metal, a rare earth metal, and a compound of the above metal (e.g., an alkali metal compound (e.g., an alkali metal compound (including an oxide such as lithium oxide, a halide, or a carbonate such as lithium carbonate or cesium carbonate), an alkaline earth metal compound (including an oxide, a halide, or a carbonate), or a rare earth metal compound (including an oxide, a halide, or a carbonate)). Note that as the substance having a high electron-transport property, a material similar to the material for the electron-transport layer 704 described above can be used.

Further, the electron-relay layer 707 is preferably formed between the electron-injection buffer layer 706 and the composite material layer 708. The electron-relay layer 707 is not necessarily provided; however, by providing the electron-relay layer 707 having a high electron-transport property, electrons can be rapidly transported to the electron-injection buffer layer 706.

The structure in which the electron-relay layer 707 is sandwiched between the composite material layer 708 and the electron-injection buffer layer 706 is a structure in which the acceptor substance contained in the composite material layer 708 and the donor substance contained in the electron-injection buffer layer 706 are less likely to interact with each other; thus, their functions hardly interfere with each other. Thus, an increase in the driving voltage can be prevented.

The electron-relay layer 707 contains a substance having a high electron-transport property and is formed so that the LUMO level of the substance having a high electron-transport property is located between the LUMO level of the acceptor substance contained in the composite material layer 708 and the LUMO level of the substance having a high electron-transport property contained in the electron-transport layer 704. In the case where the electron-relay layer 707 contains a donor substance, the donor level of the donor substance is controlled so as to be located between the LUMO level of the acceptor substance in the composite material layer 708 and the LUMO level of the substance having a high electron-transport property contained in the electron-transport layer 704. As a specific value of the energy level, the LUMO level of the substance having a high electron-transport property contained in the electron-relay layer 707 is preferably higher than or equal to −5.0 eV, more preferably higher than or equal to −5.0 eV and lower than or equal to −3.0 eV.

As the substance having a high electron-transport property contained in the electron-relay layer 707, a phthalocyanine-based material or a metal complex having a metal-oxygen bond and an aromatic ligand is preferably used.

As the metal complex having a metal-oxygen bond and an aromatic ligand, which is contained in the electron-relay layer 707, a metal complex having a metal-oxygen double bond is preferably used. The metal-oxygen double bond has acceptor properties (properties of easily accepting electrons); thus, electrons can be transferred (donated and accepted) more easily. Further, the metal complex having a metal-oxygen double bond is considered stable. Thus, the use of the metal complex having a metal-oxygen double bond makes it possible to drive the light-emitting element at a low voltage more stably.

A phthalocyanine-based material is preferable as the metal complex having a metal-oxygen bond and an aromatic ligand. In particular, a substance in which a metal-oxygen double bond is more likely to act on another molecular in terms of a molecular structure and having a high acceptor property is preferably used.

Note that a phthalocyanine-based material having a phenoxy group is preferable as the phthalocyanine-based materials described above. Specifically, a phthalocyanine derivative having a phenoxy group, such as PhO-VOPc, is preferable. The phthalocyanine derivative having a phenoxy group is soluble in a solvent; thus, the phthalocyanine derivative has an advantage of being easily handled during formation of a light-emitting element and an advantage of facilitating maintenance of an apparatus used for deposition.

The electron-relay layer 707 may further contain a donor substance. Examples of the donor substance include organic compounds such as tetrathianaphthacene (abbreviation: TTN), nickelocene, and decamethylnickelocene, in addition to an alkali metal, an alkaline earth metal, a rare earth metal, and a compound of the above metals (e.g., an alkali metal compound (including an oxide such as lithium oxide, a halide, and a carbonate such as lithium carbonate or cesium carbonate), an alkaline earth metal compound (including an oxide, a halide, and a carbonate), and a rare earth metal compound (including an oxide, a halide, and a carbonate)). When such a donor substance is contained in the electron-relay layer 707, electrons can be transferred easily and the light-emitting element can be driven at a lower voltage.

In the case where a donor substance is contained in the electron-relay layer 707, in addition to the materials described above, a substance having a LUMO level higher than the acceptor level of the acceptor substance contained in the composite material layer 708 can be used as the substance having a high electron-transport property. Specifically, it is preferable to use a substance having a LUMO level of higher than or equal to −5.0 eV, preferably higher than or equal to −5.0 eV and lower than or equal to −3.0 eV. Examples of such a substance include a perylene derivative and a nitrogen-containing condensed aromatic compound. Note that a nitrogen-containing condensed aromatic compound is preferably used for forming the electron-relay layer 707 because of its stability.

Note that in the case where a donor substance is contained in the electron-relay layer 707, the electron-relay layer 707 may be formed by a method such as co-evaporation of the substance having a high electron-transport property and the donor substance.

The hole-injection layer 701, the hole-transport layer 702, the layer 703 containing a light-emitting organic compound, and the electron-transport layer 704 may each be formed using any of the above-described materials.

In the above manner, the EL layer 105 of this embodiment can be manufactured.

This embodiment can be combined with any of the other embodiments disclosed in this specification as appropriate.

Embodiment 4

In this embodiment, examples of a lighting device including a light-emitting device according to an embodiment of the present invention will be described with reference to FIGS. 7A and 7B.

According to an embodiment of the present invention, a lighting device in which a light-emitting portion has a curved surface can be realized.

A light-emitting device of one embodiment of the present invention can be used for lighting in a car; for example, lighting can be provided for a dashboard, ceiling, or the like.

Figure 7A:
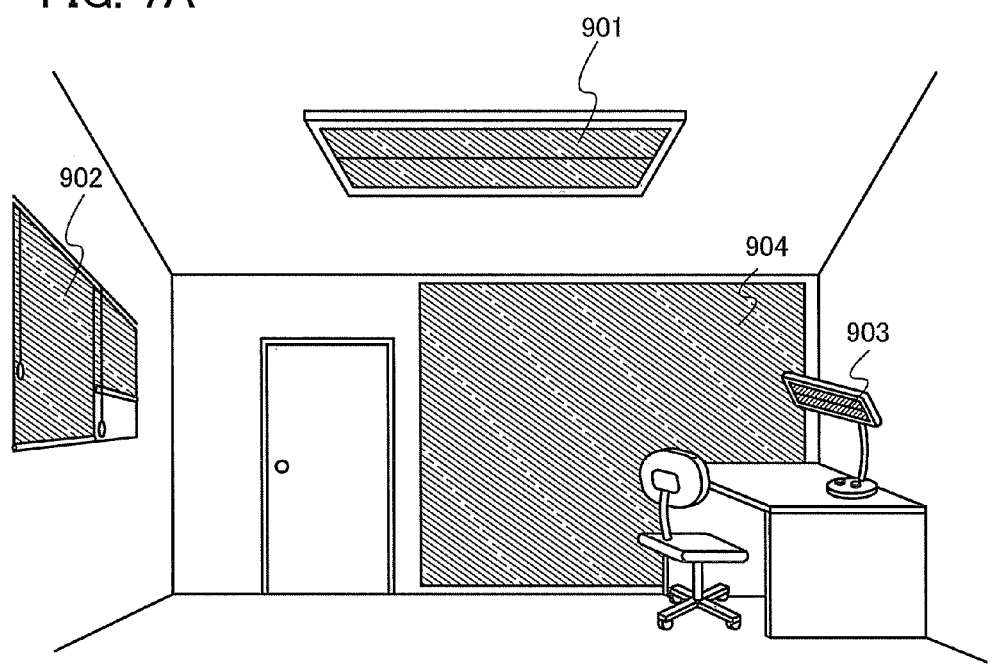
FIGS. 7A and 7B each illustrate a lighting device according to one embodiment of the present invention.

FIG. 7A illustrates an interior lighting device 901, a desk lamp 903, and a planar lighting device 904 to which a light-emitting device of one embodiment of the present invention is applied. Since the light-emitting device can have a larger area, it can be used as a lighting device having a large area. Further, since the light-emitting device is thin, the light-emitting device can be mounted on a wall. Furthermore, the light-emitting device can be used as a roll-type lighting device 902.

Figure 7B:
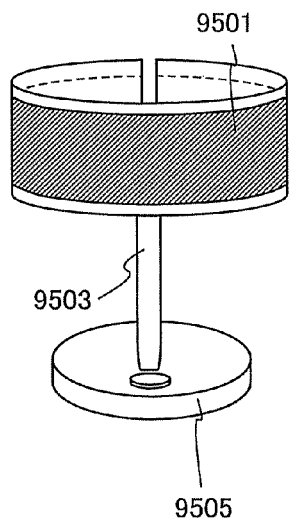

FIG. 7B illustrates another example of the lighting device. A desk lamp illustrated in FIG. 7B includes a lighting portion 9501, a support 9503, a support base 9505, and the like. The lighting portion 9501 includes a light-emitting device according to an embodiment of the present invention. According to an embodiment of the present invention, a lighting device having a curved surface or a lighting device including a flexible lighting portion can be realized in this manner. The use of a flexible light-emitting device for a lighting device as described above not only improves the degree of freedom in design of the lighting device but also enables the lighting device to be mounted onto a portion having a curved surface, such as the ceiling or a dashboard of a car.

This embodiment can be combined with any of the other embodiments disclosed in this specification as appropriate.

This application is based on Japanese Patent Application serial no. 2011-064678 filed with Japan Patent Office on Mar. 23, 2011, and Japanese Patent Application serial no. 2011-066900 filed with Japan Patent Office on Mar. 25, 2011, the entire contents of which are hereby incorporated by reference.

What is claimed is:

1. A method for manufacturing a light-emitting device, comprising the steps of:
    forming a first pair of wirings and a second pair of wirings over and in contact with a same surface of a first substrate;
    forming a planarization layer over the first pair of wirings, the second pair of wirings, and the first substrate;
    forming a lower electrode layer over the planarization film and in electrical contact with the first pair of wirings;

forming a light-emitting organic compound layer over the lower electrode layer;
forming an upper electrode layer over the light-emitting organic compound layer to form a light-emitting element, wherein the upper electrode layer is in electrical contact with the second pair of wirings;
forming an electrical connector over a portion of the upper electrode layer;
forming first and second pluralities of wirings over a second substrate; and
bonding the first substrate and the second substrate so that the upper electrode layer is in contact with the first plurality of wirings, and the electrical connector is in direct contact with the second plurality of wirings;
forming a first lens array having a first diameter over the second substrate; and
forming a second lens array having a second diameter different from the first diameter over the second substrate;
wherein the second substrate is capable of transmitting light emitted from the light-emitting element,
wherein a sealant is provided between the upper electrode layer and the second substrate,
wherein a refractive index of the sealant is higher than a refractive index of the upper electrode layer and is lower than a refractive index of the second substrate,
wherein the first plurality of wirings overlaps the light-emitting organic compound layer, and
wherein a portion of a bottom surface of the lower electrode layer, a portion of a bottom surface of the light-emitting compound layer, and a portion of the bottom surface of the upper electrode layer are in direct contact with a top surface of the planarization film.

2. A method for manufacturing a light-emitting device, comprising the steps of:
forming a first pair of wirings and a second pair of wirings over and in contact with a same surface of a first substrate;
forming a planarization layer over the first pair of wirings, the second pair of wirings, and the first substrate;
forming a light-emitting element in which a lower electrode layer, a layer containing a light-emitting compound, and an upper electrode layer are stacked in this order over the planarization film and the same surface of the first substrate;
forming an electrical connector over a portion of the upper electrode layer;
forming a third wiring over a second substrate; and
bonding the first substrate and the second substrate so that the upper electrode layer is in contact with a first portion of the third wiring, and the electrical connector is in direct contact with a second portion of the third wiring;
forming a first lens array over the second substrate; and
forming a second lens array having a second diameter different from the first diameter over the first lens array,
wherein the lower electrode layer is in electrical contact with the first pair of wirings and the upper electrode layer is in electrical contact with the second pair of wirings;
wherein the second substrate is capable of transmitting light emitted from the light-emitting element,
wherein a sealant is provided between the upper electrode layer and the second substrate,
wherein a refractive index of the sealant is higher than a refractive index of the upper electrode layer and is lower than a refractive index of the second substrate,
wherein a portion of a bottom surface of the lower electrode layer, a portion of a bottom surface of the light-emitting compound layer, and a portion of the bottom surface of the upper electrode layer are in direct contact with a top surface of the planarization film.

3. The method for manufacturing a light-emitting device according to claim 2, wherein the third wiring contains copper.

4. The method for manufacturing a light-emitting device according to claim 2, wherein the first substrate is formed using a metal or an alloy whose surface is subjected to an insulation treatment.

5. The method for manufacturing a light-emitting device according to claim 2, wherein the third wiring overlaps the layer containing the light-emitting compound.

* * * * *